(12) United States Patent
Cui et al.

(10) Patent No.: US 12,119,797 B2
(45) Date of Patent: Oct. 15, 2024

(54) VARIABLE GAIN AMPLIFIER AND PHASED ARRAY TRANSCEIVER

(71) Applicant: HUAWEI TECHNOLOGIES CO., LTD., Guangdong (CN)

(72) Inventors: Keji Cui, Shanghai (CN); Yongli Wang, Shenzhen (CN); Lei Lu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 430 days.

(21) Appl. No.: 17/490,900

(22) Filed: Sep. 30, 2021

(65) Prior Publication Data

US 2022/0021363 A1 Jan. 20, 2022

Related U.S. Application Data

(63) Continuation of application No. PCT/CN2019/080704, filed on Mar. 30, 2019.

(51) Int. Cl.
*H03F 3/45* (2006.01)
*H03F 1/22* (2006.01)
*H03G 1/00* (2006.01)

(52) U.S. Cl.
CPC ........... *H03G 1/0088* (2013.01); *H03F 1/223* (2013.01); *H03F 3/45188* (2013.01);
(Continued)

(58) Field of Classification Search
CPC .. H03G 1/0088; H03G 1/0029; H03G 1/0023; H03G 3/45098; H03G 3/3042;
(Continued)

(56) References Cited

U.S. PATENT DOCUMENTS 6,670,847 B1 12/2003 Rokhsaz
7,023,272 B2 * 4/2006 Hung ...................... H03F 1/223
330/311
(Continued)

FOREIGN PATENT DOCUMENTS

CN 1502164 A 6/2004
CN 101335504 A 12/2008
(Continued)

OTHER PUBLICATIONS

Extended European Search Report issued in European Application No. 19922592.1 on Feb. 3, 2022, 9 pages.
(Continued)

*Primary Examiner* — Khanh V Nguyen
(74) *Attorney, Agent, or Firm* — Fish & Richardson P.C.

(57) ABSTRACT

This application provides example variable gain amplifiers and example phased array transceivers. One example variable gain amplifier includes an amplification circuit, configured to amplify an input signal; a control circuit, configured to control a gain of the amplification circuit by adjusting an output current of the amplification circuit; an inductive load, where the inductive load is coupled to a signal output end of the amplification circuit; and an inductive adjustment circuit, where the inductive adjustment circuit and the inductive load are inductively coupled, and where the inductive adjustment circuit is adjustable.

20 Claims, 17 Drawing Sheets

(52) U.S. Cl.
CPC ..... *H03G 1/0029* (2013.01); *H03F 2200/294* (2013.01); *H03F 2200/318* (2013.01)

(58) Field of Classification Search
CPC ...... H03G 3/3036; H03G 3/001; H03F 1/223; H03F 3/45188; H03F 2200/294; H03F 2200/318; H03F 3/193; H03F 2200/306; H03F 2200/537; H03F 2203/45302; H03F 2203/45662; H03F 2203/45704; H03F 2203/45731; H03F 3/245; H03F 3/68; H03F 2200/451; H03F 2203/45318; H03F 3/45183; H03F 1/22
USPC .................................. 330/254, 278, 279, 311
See application file for complete search history.

(56) References Cited

U.S. PATENT DOCUMENTS

| | | | | |
|---|---|---|---|---|
| 9,923,712 | B2* | 3/2018 | Shirinfar | H04L 5/006 |
| 10,256,894 | B2* | 4/2019 | Eitan | H04B 7/086 |
| 2009/0251218 | A1* | 10/2009 | Oliveira | H03G 3/10 |
| | | | | 330/278 |
| 2012/0220255 | A1 | 8/2012 | Khoini-Poorfard | |

FOREIGN PATENT DOCUMENTS

| | | |
|---|---|---|
| CN | 105009447 A | 10/2015 |
| CN | 105103442 A | 11/2015 |
| CN | 107911092 A | 4/2018 |
| CN | 108768312 A | 11/2018 |
| CN | 109088604 A | 12/2018 |

OTHER PUBLICATIONS

Garg et al., "A 28-GHz Low-Power Phased-Array Receiver Front-End With 360° RTPS Phase Shift Range," IEEE Transactions on Microwave Theory and Techniques, vol. 65, No. 11, Jun. 2017, 12 pages.

Pham et al., "A Q-enhanced Transformer Coupling Dynamic Dual-Mode 5GHz Bandpass NB / Interference Rejection UWB Filter," 2007 IEEE Custom Integrated Circuits Conference, Sep. 2007, 4 pages.

PCT International Search Report and Written Opinion issued in International Application No. PCT/CN2019/080704 on Jan. 3, 2020, 14 pages (with English translation).

* cited by examiner

VARIABLE GAIN AMPLIFIER AND PHASED ARRAY TRANSCEIVER

CROSS-REFERENCE TO RELATED APPLICATIONS

This application is a continuation of International Application No. PCT/CN2019/080704, filed on Mar. 30, 2019. The disclosure of which is hereby incorporated by reference in its entirety.

TECHNICAL FIELD

This application relates to the field of circuit technologies, and in particular, to a variable gain amplifier and a phased array transceiver.

BACKGROUND

A variable gain amplifier (VGA) is a common circuit component, may be configured to amplify a signal, and an amplification factor is adjustable. The VGA is widely used in a variety of devices such as an acoustic wave receiver, a radar receiver, and a global positioning system (GPS) receiver.

With development of a fifth generation mobile communication (5G) technology, a phased array technology has gradually become a development direction of 5G communication. For a radio frequency link, when an input signal of a circuit at a stage is strong, a gain of a previous stage circuit or the module needs to be reduced to avoid output saturation. In a system, the VGA is required to change a gain. Compared with a conventional low frequency circuit, a VGA in a phased array has special requirements. First, in the phased array system, when the VGA changes a gain, an output signal phase needs to be kept constant, to avoid changing a receiving/sending angle of an antenna when the gain is switched. Second, for a large-bandwidth scenario of a millimeter wave frequency band, for signals in a same bandwidth, signals at different frequencies need to have a same gain step.

In an actual application, the VGA may be implemented by using an active circuit. For example, FIG. 1 shows a circuit topology for implementing a VGA by using a cascode structure. An $M_2$ transistor may be referred to as a common-gate transistor, and an $M_3$ transistor may be referred to as a common-source transistor. A circuit structure including $M_2$ and $M_3$ may also be referred to as the common-source common-gate structure (cascode structure). In FIG. 1, an $M_1$ transistor may also be considered as a common-gate transistor and mainly functions as a shunt, and a source of the $M_1$ transistor is coupled to a drain of $M_3$. When the $M_1$ transistor is turned off, an entire alternating current flows into $Z_L$, and a gain of the VGA is large. $Z_L$ may be considered as an equivalent impedance of an output matching network and a next-stage circuit. When the $M_1$ transistor is turned on, the alternating current is shunted by the $M_1$ transistor, a current flowing into $Z_L$ decreases, and the gain of the VGA decreases.

However, the VGA shown in FIG. 1 has the following problems: First, when a common-gate transistor is switched, the $M_1$ transistor directly introduces the alternating current to an alternating current ground (a power supply voltage), but proportions of the alternating current introduced are different for signals at different frequencies. Therefore, the VGA shown in FIG. 1 has different gain steps for the signals at different frequencies. Second, when the $M_1$ transistor is turned on and turned off, load capacitances of the output matching network are different, and output phases of the VGA are inconstant at different gains.

In addition, for other active VGAs, there are also problems that the phase of the VGA shown in FIG. 1 is inconstant and a gain step is unstable with a change in a frequency. Therefore, a variable gain amplifier is urgently needed, to enable the variable gain amplifier to keep a phase constant when switching a gain and enable a gain step to be stable with a frequency.

SUMMARY

Embodiments of this application provide a variable gain amplifier and a phased array transceiver, to enable the variable gain amplifier to keep a phase constant when switching a gain, and to enable a gain step to be stable with a frequency.

According to a first aspect, an embodiment of this application provides a variable gain amplifier. The variable gain amplifier includes: an amplification circuit, configured to amplify an input signal; a control circuit, configured to control a gain of the amplification circuit by adjusting an output current of the amplification circuit; and an inductive load and an inductive adjustment circuit, where the inductive load is coupled to a signal output end of the amplification circuit, and the inductive adjustment circuit and the inductive load are inductively coupled.

In addition, the variable gain amplifier may be coupled to a next-stage circuit through the inductive load.

According to the foregoing solution, an amplification function can be implemented by using the amplification circuit, and the gain may be variable by using the control circuit. In addition, a phase and a gain step of an output signal of the variable gain amplifier can be calibrated by using the inductive adjustment circuit inductively coupled to the inductive load.

The inductive adjustment circuit may include an inductor. Optionally, the inductor may be an adjustable inductor.

According to the foregoing solution, the phase and the gain step of the output signal of the variable gain amplifier can be flexibly adjusted by using the adjustable inductor, so that calibration accuracy is improved, and a calibration effect is better.

In a possible design, the inductive adjustment circuit may further include an adjustable resistor connected to the adjustable inductor in parallel.

In a possible design, the inductive adjustment circuit may further include a variable capacitor connected to the adjustable inductor in parallel.

According to the foregoing solution, in addition to calibrating the variable gain amplifier through mutual inductance between the inductor and the inductive load, the variable gain amplifier may be calibrated by switching a resistance value of the adjustable resistor and a capacitance value of the variable capacitor, to control any gain state of the variable gain amplifier, so as to make the calibration effect better.

In a possible design, the amplification circuit may include a first active transistor. A source of the first active transistor is coupled to the ground, a drain of the first active transistor is the signal output end of the amplification circuit, and a gate of the first active transistor is configured to input the input signal.

According to the foregoing solution, the amplification function of the variable gain amplifier can be implemented by using one active transistor.

Further, the control circuit is configured to adjust a bias voltage of the gate of the first active transistor.

According to the foregoing solution, when the bias voltage of the gate of the first active transistor changes, transconductance of the first active transistor changes, thereby changing a current of the first active transistor and changing the gain of the amplification circuit.

Further, the amplification circuit further includes a second active transistor. The second active transistor and the first active transistor constitute a differential amplification circuit, and the control circuit includes a third active transistor and a fourth active transistor. A source of the third active transistor is coupled to the ground, and a drain of the third active transistor is coupled to a drain of the second active transistor. A source of the fourth active transistor is coupled to the ground, and a drain of the fourth active transistor is coupled to the drain of the first active transistor. Each of a gate of the third active transistor and a gate of the fourth active transistor is configured to receive a control voltage to control on/off, or bias voltages of the gate of the third active transistor and the gate of the fourth active transistor are adjustable.

According to the foregoing solution, a differential input signal can be amplified by using the first active transistor and the second active transistor. The third active transistor and the fourth active transistor respectively inject reverse currents into the second active transistor and the first active transistor, to implement gain adjustment of the variable gain amplifier.

In a possible design, the amplification circuit includes a first cascode amplifier. A drain of a first common-gate transistor in the first cascode amplifier is the signal output end of the amplification circuit, a gate of a first common-source transistor in the first cascode amplifier is configured to input the input signal, and a source of the first common-source transistor is coupled to the ground.

According to the foregoing solution, the amplification function of the variable gain amplifier can be implemented by using the first cascode amplifier.

Further, the control circuit includes a first active transistor. A source of the first active transistor is connected to a source of the first common-gate transistor. A drain of the first active transistor is coupled to a first power supply voltage, or the drain of the first active transistor is coupled to one end of the inductive adjustment circuit, and the other end of the inductive adjustment circuit is coupled to a second power supply voltage. A gate of the first active transistor is configured to receive a control voltage to control on/off of the first active transistor, or a bias voltage of the gate of the first active transistor is adjustable.

According to the foregoing solution, the first active transistor may shunt a current of the first cascode amplifier, to implement the variable gain of the variable gain amplifier.

In a possible design, the control circuit is configured to adjust a bias voltage of the first common-source transistor.

According to the foregoing solution, when the bias voltage of the gate of the first common-source transistor changes, a current of the first common-source transistor changes, thereby changing the gain of the amplification circuit.

In a possible design, the amplification circuit further includes a second cascode amplifier. The second cascode amplifier and the first cascode amplifier constitute a differential amplification circuit, and the second cascode amplifier includes a second common-gate transistor and a second common-source transistor. The control circuit includes a first active transistor and a second active transistor. A source of the first active transistor is coupled to the ground, and a drain of the first active transistor is coupled to a drain of the second common-source transistor. A source of the second active transistor is coupled to the ground, and a drain of the second active transistor is coupled to a drain of the first common-source transistor. Each of a gate of the first active transistor and a gate of the second active transistor is configured to receive a control voltage to control on/off, or bias voltages of the gate of the first active transistor and the gate of the second active transistor are adjustable.

According to the foregoing solution, a differential input signal can be amplified by using the first cascode amplifier and the second cascode amplifier. The first active transistor and the second active transistor respectively inject reverse currents into the second cascode amplifier and the first cascode amplifier, to implement gain adjustment of the variable gain amplifier.

In a possible design, the amplification circuit further includes a second cascode amplifier. The second cascode amplifier and the first cascode amplifier constitute a differential amplification circuit, and the second cascode amplifier includes a second common-gate transistor and a second common-source transistor. The control circuit includes a first active transistor and a second active transistor. A source of the first active transistor is coupled to a source of the first common-gate transistor, and a drain of the first active transistor is coupled to a drain of the second common-gate transistor. A source of the second active transistor is coupled to a source of the second common-gate transistor, and a drain of the second active transistor is coupled to the drain of the first common-gate transistor. Each of a gate of the first active transistor and a gate of the second active transistor is configured to receive a control voltage to control on/off, or bias voltages of the gate of the first active transistor and the gate of the second active transistor are adjustable.

According to the foregoing solution, a differential input signal can be amplified by using the first cascode amplifier and the second cascode amplifier. The first active transistor and the second active transistor respectively inject reverse currents into the second cascode amplifier and the first cascode amplifier, to implement gain adjustment of the variable gain amplifier.

According to a second aspect, an embodiment of this application provides a phased array transceiver. The phased array transceiver includes a plurality of phased array channels, and each phased array channel includes a low-noise amplifier, a phase shifter, and the variable gain amplifier provided in any one of the first aspect or the possible designs of the first aspect. The phase shifter is configured to implement a fixed phase shift of an input signal, and the variable gain amplifier is configured to implement a variable gain of the input signal and keep the fixed phase shift of the input signal unchanged.

Beam receiving and sending in a fixed direction can be implemented by using the phased array transceiver. The variable gain amplifier provided in any one of the first aspect or the possible designs of the first aspect is used in the phased array transceiver. Because the variable gain amplifier can calibrate a phase of an output signal, the fixed phase shift of the input signal can be kept unchanged, the beam receiving and sending in the fixed direction can be implemented, and beam precision can be improved.

DESCRIPTION OF EMBODIMENTS

Figure 1:
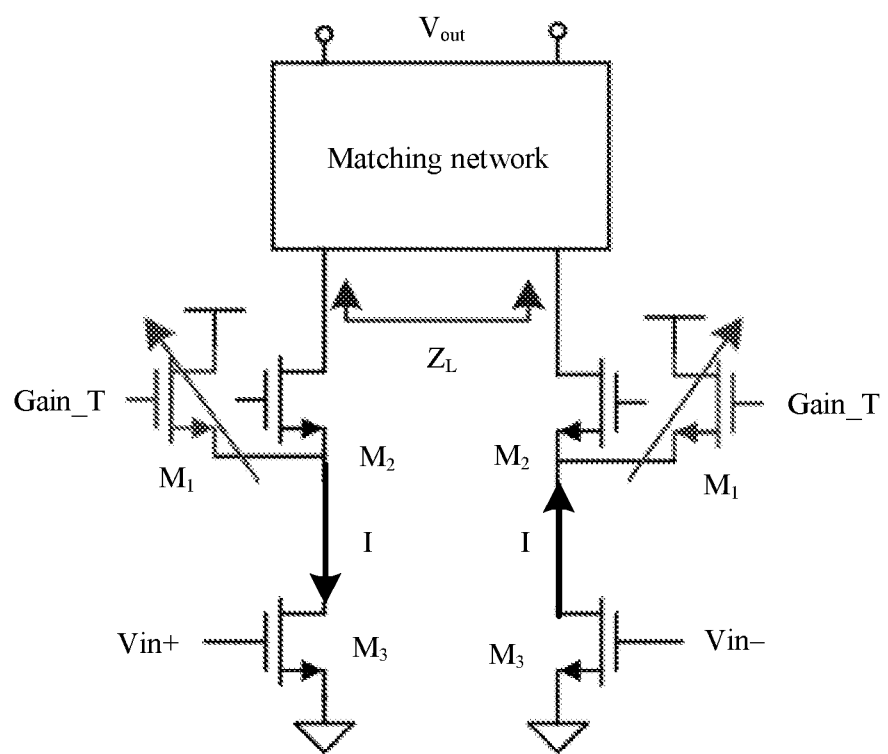
FIG. 1 is a schematic structural diagram of a variable gain amplifier according to the conventional technology.

As described in the background, there are problems that a phase of an existing active VGA is inconstant when a gain is switched and a gain step is unstable with a change in frequency. An active VGA of a cascode structure shown in FIG. 1 is used as an example. In a high gain mode, an entire alternating current I flows into $Z_L$ by using a common-gate transistor $M_2$, where $Z_L$ may be considered as an equivalent impedance of an output matching network and a next-stage circuit. In a low gain mode, an $M_1$ transistor shunts the alternating current, and a gain of the VGA decreases. When the gain is switched, the $M_1$ transistor has two states: an on state and an off state, and a load capacitance of the output matching network is changed when the $M_1$ transistor is on and off. Therefore, load capacitances of the output matching network are different in the low gain mode and the high gain mode. As a result, a phase of the active VGA is inconstant when the gain is switched.

In addition, in the low gain mode, the $M_1$ transistor introduces the alternating current to an alternating current ground (a power supply voltage). However, for signals at different frequencies, proportions of the alternating current introduced by the $M_1$ transistor are different. Therefore, the VGA shown in FIG. 1 has different gain steps for the signals at different frequencies.

Based on this, embodiments of this application provide a variable gain amplifier and a phased array transceiver, to enable the variable gain amplifier to keep a phase constant when switching a gain, and to enable a gain step to be stable with a frequency.

It should be noted that in the embodiments of this application, "a plurality of" means two or more. In addition, it should be understood that, in descriptions of this application, terms such as "first" and "second" are merely used for distinguishing descriptions and are neither intended to indicate or imply relative importance nor intended to indicate or imply a sequence. "Coupling" in this application refers to an electrical connection, and may specifically include two manners: a direct connection or an indirect connection. An application scenario of the embodiments of this application is briefly described below.

The embodiments of this application may be applied to an application scenario that requires relatively high phase precision and gain step precision for the VGA.

For example, in a 5G millimeter wave frequency band, a phased array antenna may include a plurality of transmit and receive channels, and each transmit and receive channel includes a low-noise amplifier (LNA), a phase shifter (PS), and the VGA. To implement beam receiving and sending in a fixed direction, each receive channel needs to be switched to a fixed phase shift. For example, phase shifts of four receive channels are respectively $\varphi 1$, $\varphi 2$, $\varphi 3$, and $\varphi 4$, and the phase shifts are implemented by the PS.

However, the VGA of each transmit and receive channel introduces a phase shift when a gain is switched. In addition, for the 5G millimeter wave frequency band, because a frequency of a radio frequency signal is relatively high (for example, may be a 28 GHz frequency band or a 38 GHz frequency band in which a new radio (New Radio, NR) frequency band is located), a delay of an amplifier module, for example, the LNA or the VGA, on the transmit and receive channel also causes large phase fluctuation. The phase shift of the transmit and receive channel is not fixed, which affects a direction and a gain of a beam. In addition, for a large-bandwidth scenario of a millimeter wave frequency band, for signals at different frequencies in a same bandwidth, because proportions of an alternating current introduced to the ground when the VGA switches the gain are different, it is difficult for the transmit and receive channel to ensure that the signals at different frequencies have a same gain step.

Therefore, in the 5G millimeter wave frequency band, the phased array antenna has relatively high requirements for phase precision and gain step precision. As a result, it is difficult to meet a use requirement of the phased array antenna by using a conventional active VGA.

For example, in an in-vehicle millimeter wave radar system, a transmit signal and a receive signal of an in-vehicle radar is millimeter wave. Therefore, a requirement for phase accuracy (equivalent to a delay) is very high, and a constant phase needs to be ensured when the VGA switches a gain. As a result, it is difficult to meet a use requirement of the in-vehicle millimeter wave radar system by using the conventional active VGA.

In conclusion, for an application scenario that requires relatively high phase precision and gain step precision, for example, the phased array antenna in the 5G millimeter wave frequency band and the in-vehicle millimeter wave radar, the VGA provided in the embodiments of this application may be used, so that the phase can be kept constant when the VGA switches the gain, and the gain step is stable with the frequency.

Figure 2:
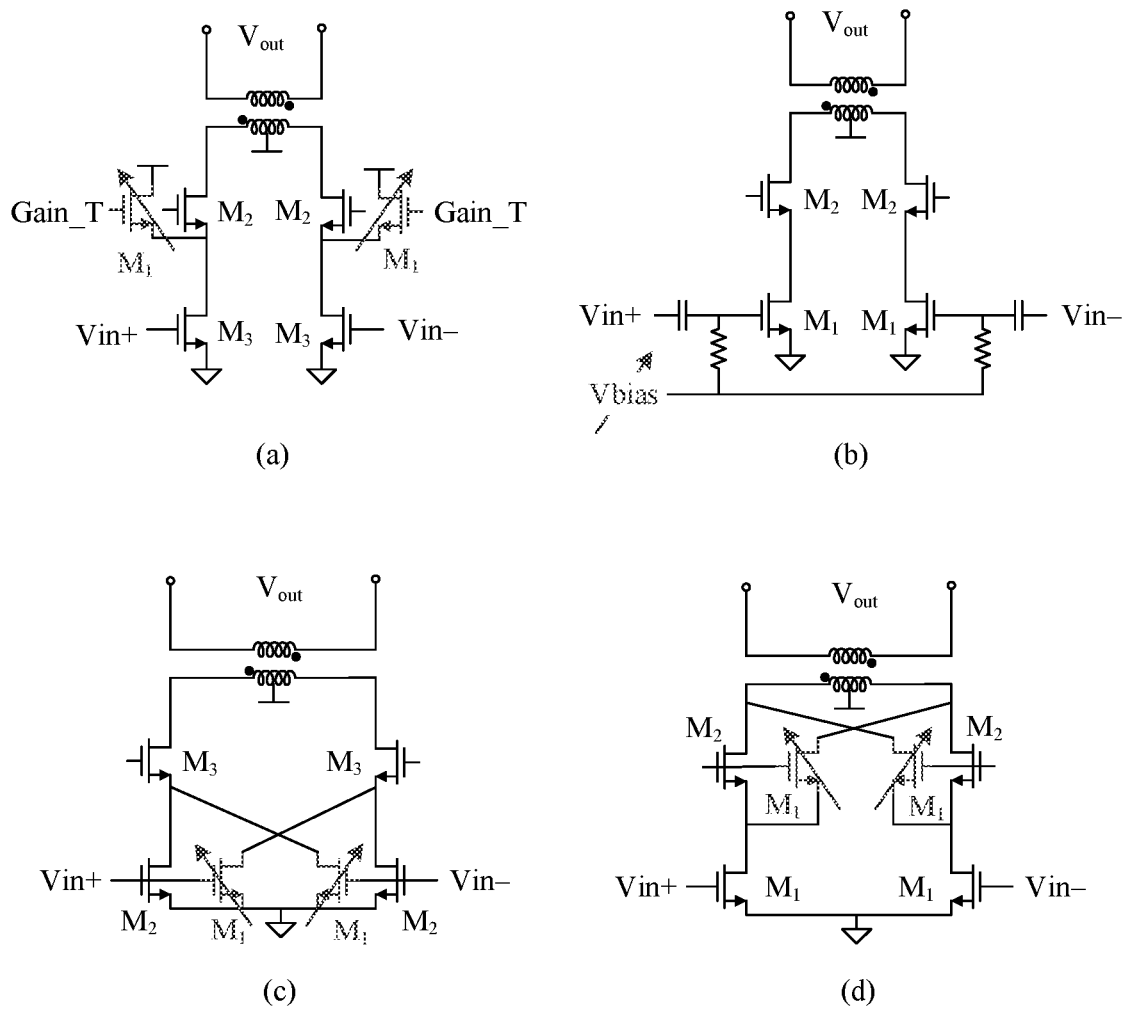
FIG. 2 is a schematic structural diagram of four existing active VGAs according to the conventional technology.

FIG. 2 is a schematic structural diagram of four existing active VGAs. In an example (a) (a working principle is the same as that of the VGA shown in FIG. 1), a manner of switching a common-gate transistor is used. When an $M_1$ transistor is turned on, an alternating current is shunted by the $M_1$ transistor, to implement gain switching. In an example (b), a method of switching a bias of a common-source transistor is used. When the bias voltage Vbias changes, transconductance of the $M_1$ transistor changes accordingly, to implement a variable gain. In an example (c), a manner of injecting a reverse alternating current by the $M_1$ transistor is used to reduce a final output alternating current (on and off of the $M_1$ transistor may be configured or a gate bias voltage may be adjusted), so as to implement a gain switching function. In an example (d) similar to the example (c), the common-gate transistor $M_1$ is used to control the reverse current.

It should be noted that in the examples in FIG. 2, differential structures are used as examples for illustration. In an actual application, a single-ended structure may alternatively be used for the active VGA. In addition, in the examples in FIG. 2, the active transistor uses a complementary metal-oxide-semiconductor (CMOS) process. In an actual application, the active transistor may alternatively use another process, for example, a bipolar junction transistor (bipolar junction transistor, BJT) process. A specific type and a specific process of the active transistor are not limited in this embodiment of this application.

The following further describes in detail the embodiments of this application with reference to accompanying drawings.

Figure 3:
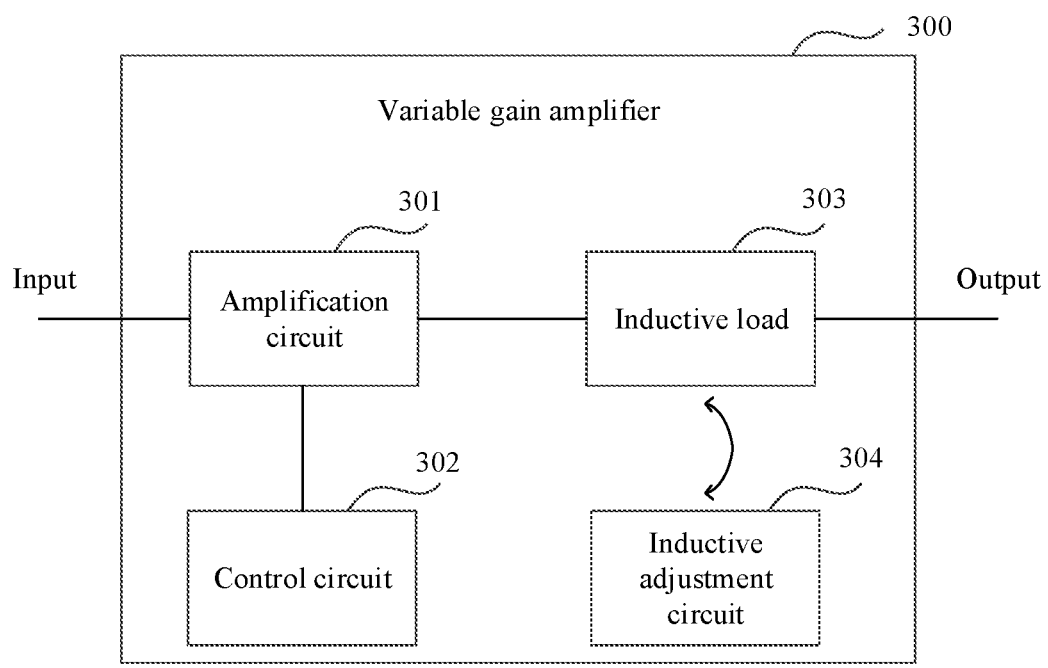
FIG. 3 is a schematic structural diagram of a first variable gain amplifier according to an embodiment of this application.

FIG. 3 is a schematic structural diagram of a variable gain amplifier 300 according to an embodiment of this application. The variable gain amplifier 300 includes:

an amplification circuit 301, configured to amplify an input signal;

a control circuit 302, configured to control a gain of the amplification circuit 301 by adjusting an output current of the amplification circuit 301; and an inductive load 303 and an inductive adjustment circuit 304, where the inductive load 303 is coupled to a signal output end of the amplification circuit 301, the inductive adjustment circuit 304 and the inductive load 303 are inductively coupled (also referred to as magnetically coupled), and the inductive adjustment circuit 304 is adjustable.

It should be noted that, in this embodiment of this application, the amplification circuit 301 may be configured to amplify the input signal, in other words, implement a fixed gain of the input signal. The control circuit 302 may adjust the gain of the amplification circuit 301. The amplification circuit 301, the control circuit 302, and the inductive load 303 may be considered as an active VGA in the conventional technology. In this embodiment of this application, the inductive adjustment circuit 304 is added on the basis of an existing active VGA, so that a phase of an output signal of the variable gain amplifier 300 is consistent with a phase of the input signal. In addition, when frequencies of input signals are different, gain steps of the variable gain amplifier 300 are kept the same (to be specific, the phase and the gain step of the output signal of the variable gain amplifier 300 are calibrated).

In this embodiment, for example, when the amplification circuit 301 is a cascode amplifier, a drain of a common-gate transistor is the signal output end of the amplification circuit 301. When the amplification circuit 301 is a transistor, a drain of the transistor is the signal output end of the amplification circuit 301. For details, refer to the conventional technology. Examples are not enumerated herein.

The inductive load 303 is coupled between the signal output end of the amplification circuit 301 and an output end of the variable gain amplifier 300. The amplification circuit 301 is coupled to a next-stage circuit through the inductive load 303. Specifically, the next-stage circuit is connected to the output end of the variable gain amplifier 300. For example, the inductive load 303 may be an output matching network, or a component, for example, a balun. In addition, the variable gain amplifier 300 may be coupled to the next-stage circuit through the inductive load 303.

The inductive adjustment circuit 304 may be considered as a component independent of the inductive load 303. Specifically, the inductive adjustment circuit 304 may be independently disposed on a side close to the inductive load 303 and far from the output end of the variable gain amplifier 300. Alternatively, the inductive adjustment circuit 304 may be connected to the control circuit 302 in series.

In this embodiment of this application, the phase and the gain step of the output signal of the variable gain amplifier 300 can be calibrated through mutual inductance between the inductive load 303 and the inductive adjustment circuit 304.

In a specific implementation, the inductive adjustment circuit 304 may include an inductor. It should be noted that, when the inductive load 303 is the balun, the inductive load 303 usually includes a primary coil and a secondary coil inductively coupled to the primary coil. The primary coil is coupled to the signal output end of the amplification circuit 301, and the secondary coil is coupled to the next-stage circuit. In this application, the inductive adjustment circuit 304 is an inductor independent of the inductive load 303. The inductor is also inductively coupled to the primary coil, but is different from the secondary coil. Other types of output matching networks are similar to the inductive load 303, and details are not described herein again. The inductor may be an adjustable inductor. If the inductor in the inductive adjustment circuit 304 is an adjustable inductor, the phase of the output signal and the gain step of the variable gain amplifier 300 can be flexibly adjusted by using the inductive adjustment circuit 304, so that calibration accuracy is improved, and a calibration effect is better.

In a possible design, the inductive adjustment circuit 304 may further include an adjustable resistor connected to the adjustable inductor in parallel.

In a possible design, the inductive adjustment circuit 304 may further include a variable capacitor connected to the adjustable inductor in parallel.

In the foregoing implementation, in addition to calibrating the variable gain amplifier 300 through mutual inductance between the inductor and the inductive load 303, the variable gain amplifier 300 may be calibrated by switching a resistance value of the adjustable resistor and a capacitance value of the variable capacitor, to control any gain state of the variable gain amplifier 300, so as to make the calibration effect of the inductive adjustment circuit 304 better.

As described above, in this embodiment of this application, the inductive adjustment circuit 304 may be independently disposed on the side close to the inductive load 303 and far from the output end of the variable gain amplifier 300, or may be disposed in the control circuit 302. An example in which the inductive adjustment circuit 304 is connected to the control circuit 302 in series is used, and a specific example of the variable gain amplifier 300 provided in this embodiment of this application may be shown in FIG. 4.

Figure 4:
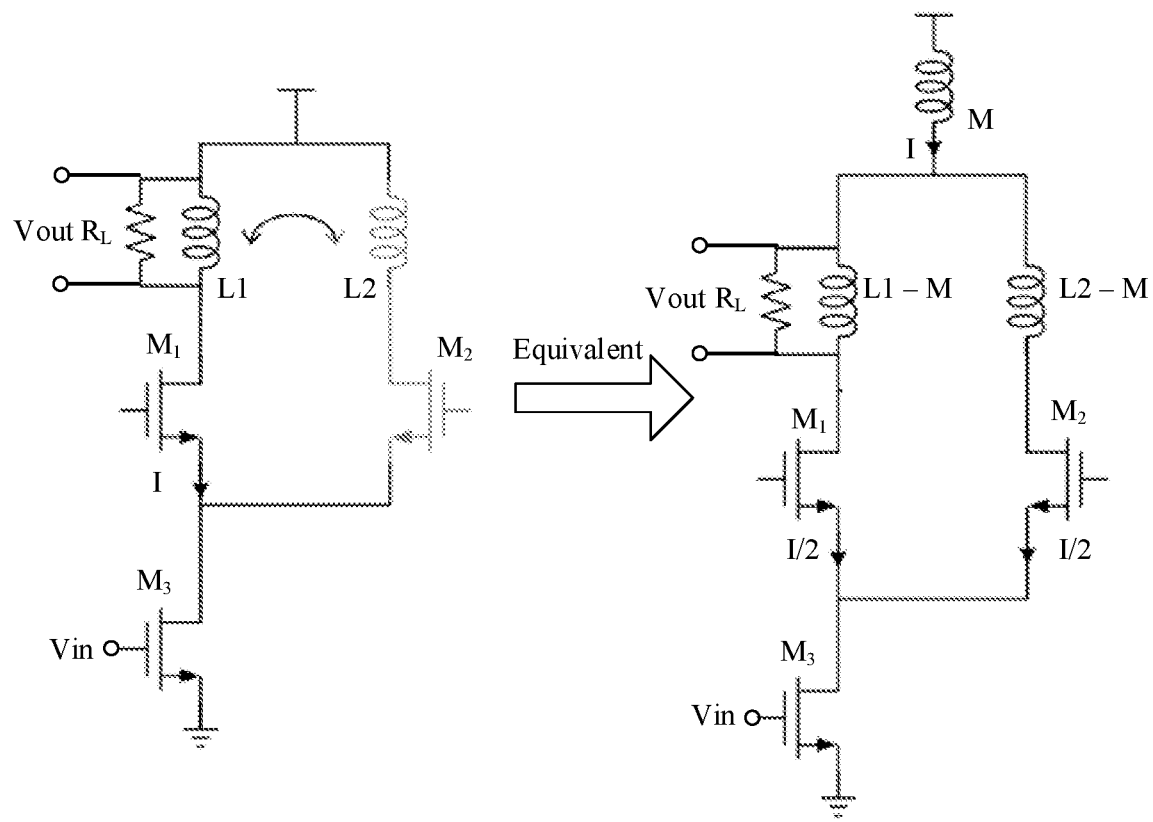
FIG. 4 is a schematic structural diagram of a second variable gain amplifier according to an embodiment of this application.

FIG. 4 shows a variable gain amplifier of a single-ended structure. $M_1$ and $M_3$ constitute an amplification circuit 301. L1 and $R_L$ may be considered as an inductive load and are connected to an output end of $M_1$. L2 may be considered as an inductive adjustment circuit. $M_2$ may be considered as a control circuit 302. When $M_2$ is turned off, L2 is similar to an open circuit, and has no impact on a main amplification path $M_1$+L1; and the variable gain amplifier implements a high gain. When $M_2$ is turned on, $M_2$ shunts a current input to the variable gain amplifier, and a shunted alternating current affects output through mutual inductance between L2 and L1, thereby implementing a low gain of the variable gain amplifier and calibrating an output signal.

Based on the mutual inductance between L1 and L2, FIG. 4 further shows an equivalent structure of the foregoing variable gain amplifier. A direct coupling between L1 and L2 is equivalent to an inductor M. Then, in a low gain mode, outputs before and after calibration are:

$$V_{out,uncal} = -\frac{I}{2} * R_L$$

$$V_{out,cal} = -\left(\frac{I}{2} * R_L + sM * I\right).$$

It can be seen from the foregoing formula that an output difference before and after calibration is mainly sM*I, where sM is a frequency domain impedance of the inductor M. Because an output signal obtained after calibration includes the sM term, and the sM term may affect a phase of the output signal in the low gain mode, the phase of the output signal of the variable gain amplifier can be calibrated. In addition, sM is a frequency-dependent impedance and therefore may be used to calibrate gain steps at different frequencies, to enable a gain step of the variable gain amplifier to be stable with a frequency.

In addition, for a variable gain amplifier of another structure provided in this embodiment of this application, the phase and the gain step of the output signal can also be calibrated through mutual inductance between the inductive load 303 and the inductive adjustment circuit 304. A calibration principle of the variable gain amplifier is similar to that of the foregoing example, and details are not described in this embodiment of this application.

In this embodiment of this application, the amplification circuit 301 is configured to amplify an input signal. In a specific implementation, the amplification circuit 301 may use the single-ended structure, or may use a differential structure. In addition, a structure that has a basic amplification function in the amplification circuit 301 may include one active transistor, or may include a cascode amplifier. Each cascode amplifier includes one common-gate transistor and one common-source transistor.

The variable gain amplifier provided in the embodiments of this application is applicable to various structures. The following describes the various structures of the variable gain amplifier.

It should be noted that, in the following examples, an example in which the active transistor uses a CMOS process is used as an example for description. In an actual application, the active transistor may alternatively use another process. When the active transistor uses the another process, names of ports on the active transistors are different, but functions are basically the same. For example, when the active transistor is a BJT, a base in the BJT is equivalent to a gate in a CMOS, a collector in the BJT is equivalent to a drain in the CMOS, and an emitter in the BJT is equivalent to a source in the CMOS. Therefore, a variable gain amplifier implemented based on an MOS transistor in this application may be equivalent to a variable gain amplifier implemented based on the BJT.

An implementation and a principle when the active transistor uses the another process are similar to those when the active transistor uses the CMOS process. Therefore, in this embodiment of this application, an example in which the active transistor uses the CMOS process is used for description. A specific implementation when the another process is used is not described in detail.

The following separately describes some specific implementations of the variable gain amplifier 300 when the structure that has the basic amplification function in the amplification circuit 301 includes the one active transistor and includes the cascode amplifier.

1. The structure that has the basic amplification function in the amplification circuit 301 includes the one active transistor.

In a specific implementation, the amplification circuit 301 may include a first active transistor. A source of the first active transistor is coupled to the ground, a drain of the first active transistor is the signal output end of the amplification circuit 301, and a gate of the first active transistor is configured to input the input signal.

That a source of the first active transistor is coupled to the ground may mean that the first active transistor is directly grounded, or the first active transistor is grounded through a component, for example, an inductor or a capacitor. In addition, in other examples in the embodiments of this application, meanings of coupling grounding are the same, and details are not described later.

In the foregoing implementation, an amplification function of the amplification circuit 301 on the input signal may be implemented by using the first active transistor. When adjusting the gain of the amplification circuit 301, the control circuit 302 may select different implementations based on different structures and different requirements of the variable gain amplifier.

It should be noted that, in the example of this embodiment of this application, the active transistor uses a manner of inputting a signal through a gate and performing coupling and grounding through a source. In an actual application, the active transistor may alternatively use a manner of inputting a signal through a source and performing coupling and grounding through a gate. This is not specifically limited in this embodiment of this application.

Implementation 1

When adjusting the gain of the amplification circuit 301, the control circuit 302 may be configured to adjust a bias voltage of the gate of the first active transistor. When the bias voltage of the gate of the first active transistor changes, transconductance of the first active transistor changes, thereby changing a current of the first active transistor and changing the gain of the amplification circuit 301.

In Implementation 1, the inductive adjustment circuit 304 is disposed independently of the amplification circuit 301 and the control circuit 302. To be specific, the inductive adjustment circuit 304 is independently disposed on the side close to the inductive load 303 and far from the output end of the variable gain amplifier 300.

Figure 5:
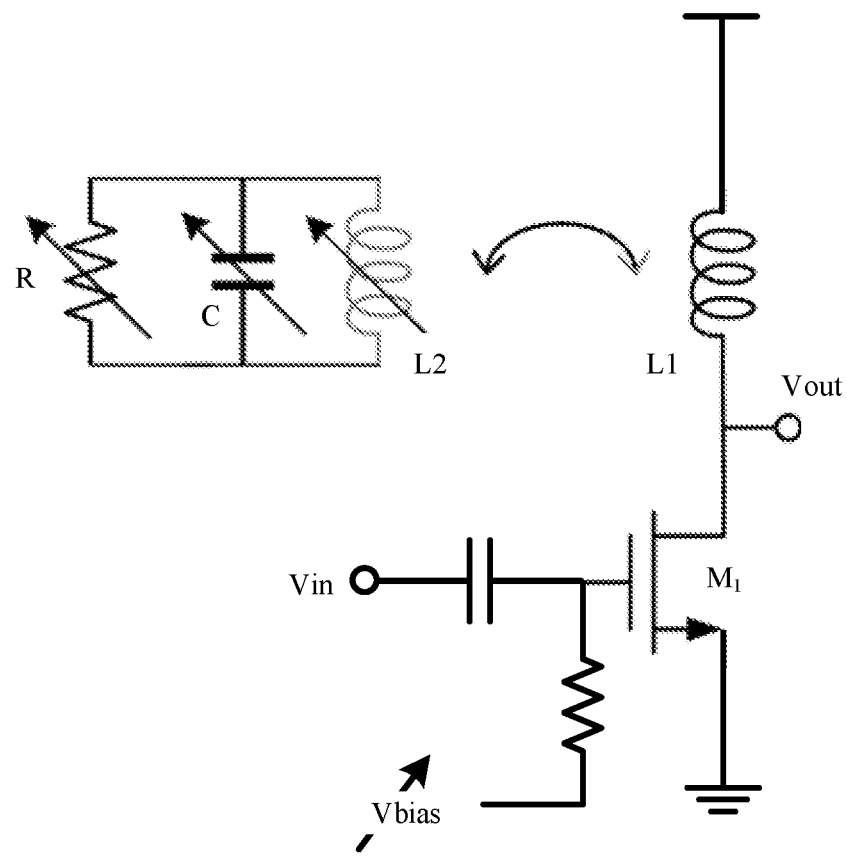
FIG. 5 is a schematic structural diagram of a third variable gain amplifier according to an embodiment of this application.

For example, a possible implementation of the variable gain amplifier may be shown in FIG. 5. In FIG. 5, L1 may be considered as an inductive load, L2, R, and C connected in parallel may be considered as an inductive adjustment circuit, and $M_1$ may be considered as a first active transistor. In the variable gain amplifier shown in FIG. 5, a current of $M_1$ may be changed by adjusting a bias voltage Vbias, thereby changing a gain of the variable gain amplifier.

In addition, calibration of a phase and a gain step of an output signal of the variable gain amplifier may be implemented by changing one or more of an inductance value of L2, a resistance value of R, and a capacitance value of C in the inductive adjustment circuit mutually inductive to L1.

Implementation 2

In Implementation 2, in addition to the first active transistor, the amplification circuit 301 further includes a second active transistor, and the second active transistor and the first active transistor constitute a differential amplification circuit 301. The control circuit 302 includes a third active transistor and a fourth active transistor.

A source of the third active transistor is coupled to the ground, and a drain of the third active transistor is coupled to a drain of the second active transistor. A source of the fourth active transistor is coupled to the ground, and a drain of the fourth active transistor is coupled to the drain of the first active transistor. A gate of the third active transistor and a gate of the fourth active transistor each is configured to receive a control voltage to control on/off, or bias voltages of a gate of the third active transistor and a gate of the fourth active transistor are adjustable.

In other words, the third active transistor and the fourth active transistor are controlled by a same control voltage, and the third active transistor and the fourth active transistor may be simultaneously turned on or simultaneously turned off; or the bias voltages applied to the gate of the third active transistor and the gate of the fourth active transistor are the same, and transconductances of the third active transistor and the fourth active transistor are the same, so that magnification factors of two differential components are the same.

In the foregoing implementation, an amplification function of the amplification circuit 301 on a differential input signal may be implemented by using the first active transistor and the second active transistor. The third active transistor is configured to inject a reverse current into the second active transistor, and the fourth active transistor is configured to inject a reverse current into the first active transistor. When the reverse current is injected, an output current of the variable gain amplifier decreases and the gain decreases. When adjusting the gain of the amplification circuit 301, the control circuit 302 may control on/off of the third active transistor and the fourth active transistor by using the control voltage, to implement high-low gain switching of the variable gain amplifier. Alternatively, currents of the third active transistor and the fourth active transistor may be changed by adjusting the bias voltages of the third active transistor and the fourth active transistor, to change a value of the injected reverse current and further change the gain of the variable gain amplifier.

In Implementation 2, the inductive adjustment circuit 304 is disposed independently of the amplification circuit 301 and the control circuit 302. To be specific, the inductive adjustment circuit 304 is independently disposed on the side close to the inductive load 303 and far from the output end of the variable gain amplifier 300. The phase and the gain step of the output signal of the variable gain amplifier can be calibrated by using the inductive adjustment circuit 304 inductively coupled to the inductive load 303.

Figure 6:
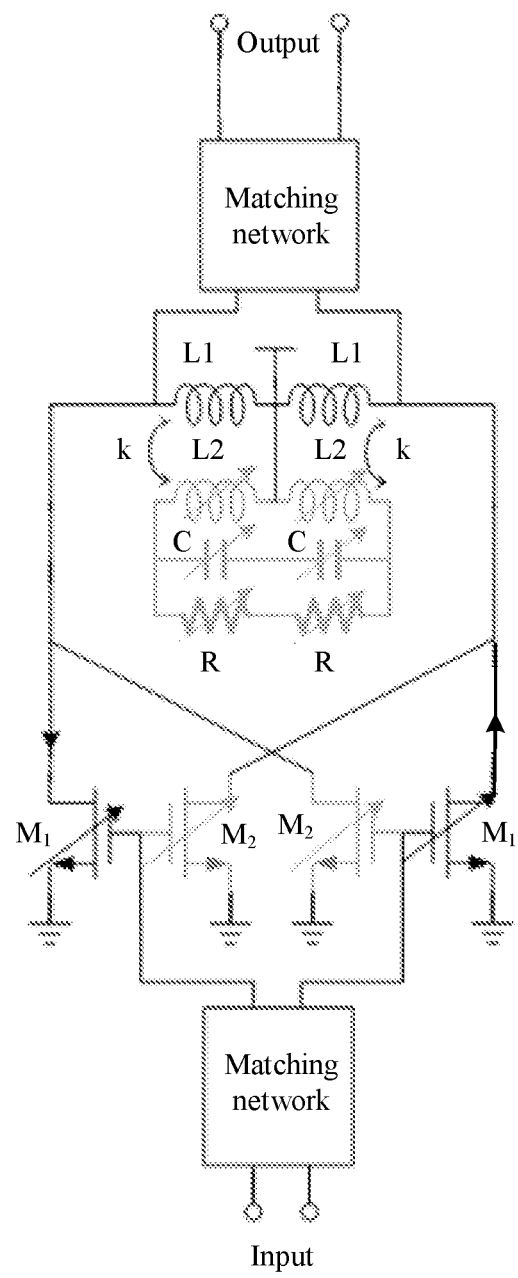
FIG. 6 is a schematic structural diagram of a fourth variable gain amplifier according to an embodiment of this application.

For example, a possible implementation of the variable gain amplifier may be shown in FIG. 6. In FIG. 6, a set of L1 and an output matching network may be considered as an inductive load. In the accompanying drawing in this embodiment of this application, L1 is separated from the output matching network to indicate that the inductor L1 in the inductive load is inductively coupled to an inductive adjustment circuit. In an actual implementation, the inductor L1 may be considered as a part of the output matching network. An adjustable resistor R, a variable capacitor C, and L2 that are connected in parallel may be considered as the inductive adjustment circuit, $M_1$ on the left may be considered as a first active transistor, and $M_1$ on the right may be considered as a second active transistor. $M_2$ on the left may be considered as a third active transistor, and $M_2$ on the right may be considered as a fourth active transistor. In the variable gain amplifier shown in FIG. 6, a current of $M_2$ may be changed by adjusting a bias voltage Vbias of $M_2$, thereby changing a gain. Reverse current injection and cutoff may also be implemented by adjusting on/off of $M_2$, thereby changing the gain.

In addition, calibration of a phase and a gain step of an output signal of the variable gain amplifier may be implemented by changing one or more of an inductance value of L2, a resistance value of R, and a capacitance value of C in an RLC network mutually inductive to L1.

It should be noted that, in an actual application, in a variable gain amplifier of a differential structure, a function of amplifying a differential component may be implemented by a plurality of active transistors connected in parallel. Correspondingly, the variable gain amplifier needs to further include a plurality of control circuits that one-to-one correspond to the plurality of active transistors. In this case, $M_1$ may also be disposed as an active transistor whose on/off is adjustable or whose bias voltage is adjustable, so that a gain variation of the variable gain amplifier is more diversified. Therefore, in the schematic diagram of FIG. 6, $M_1$ is also set to be adjustable. Adjusting $M_1$ and $M_2$ at the same time makes the gain variation of the variable gain amplifier more diversified.

2. The structure that has the basic amplification function in the amplification circuit 301 includes the cascode amplifier.

In a specific implementation, the amplification circuit 301 may include a first cascode amplifier. A drain of a first common-gate transistor in the first cascode amplifier is the signal output end of the amplification circuit 301, a gate of a first common-source transistor in the first cascode amplifier is configured to input the input signal, and a source of the first common-source transistor is coupled to the ground.

Specifically, in the first cascode amplifier, a connection relationship between the first common-gate transistor and the first common-source transistor may be as follows: The drain of the first common-gate transistor is the signal output end of the amplification circuit 301, a gate of the first common-gate transistor is configured to input a bias voltage, a source of the first common-gate transistor is coupled to a drain of the first common-source transistor, the gate of the first common-source transistor is configured to input the input signal, and the source of the first common-source transistor is coupled to the ground.

In the foregoing implementation, an amplification function of the amplification circuit 301 on the input signal may be implemented by using the first cascode amplifier. When adjusting the gain of the amplification circuit 301, the control circuit 302 may select different implementations based on different structures and different requirements of the variable gain amplifier.

Implementation 1

In Implementation 1, the control circuit 302 includes a first active transistor. A source of the first active transistor is connected to the source of the first common-gate transistor. A drain of the first active transistor is coupled to a first power supply voltage, or the drain of the first active transistor is coupled to one end of the inductive adjustment circuit 304, and the other end of the inductive adjustment circuit 304 is coupled to a second power supply voltage. A gate of the first active transistor is configured to receive a control voltage to control on/off of the first active transistor, or a bias voltage of the gate of the first active transistor is adjustable.

Power supplies that provide the first power supply voltage and the second power supply voltage may be a same power supply, or may be two power supplies that have a same specification.

In Implementation 1, the first active transistor is configured to shunt a current of the first cascode amplifier, to change an output current of the first cascode amplifier and further change a gain of the variable gain amplifier. In addition, the phase and the gain step of the output signal of the variable gain amplifier can be calibrated through mutual inductance between the inductive load 303 and the inductive adjustment circuit 304.

It is not difficult to learn that, in Implementation 1, if the drain of the first active transistor is coupled to the one end of the inductive adjustment circuit 304, and the other end of the inductive adjustment circuit 304 is coupled to the second power supply voltage, the inductive adjustment circuit 304 is connected to the control circuit 302 in series. If the drain of the first active transistor is coupled to the first power supply voltage, the inductive adjustment circuit 304 is disposed independently of the amplification circuit 301 and the control circuit 302, and the inductive adjustment circuit 304 is disposed on the side close to the inductive load 303 and far from the output end of the variable gain amplifier 300.

Figure 7:
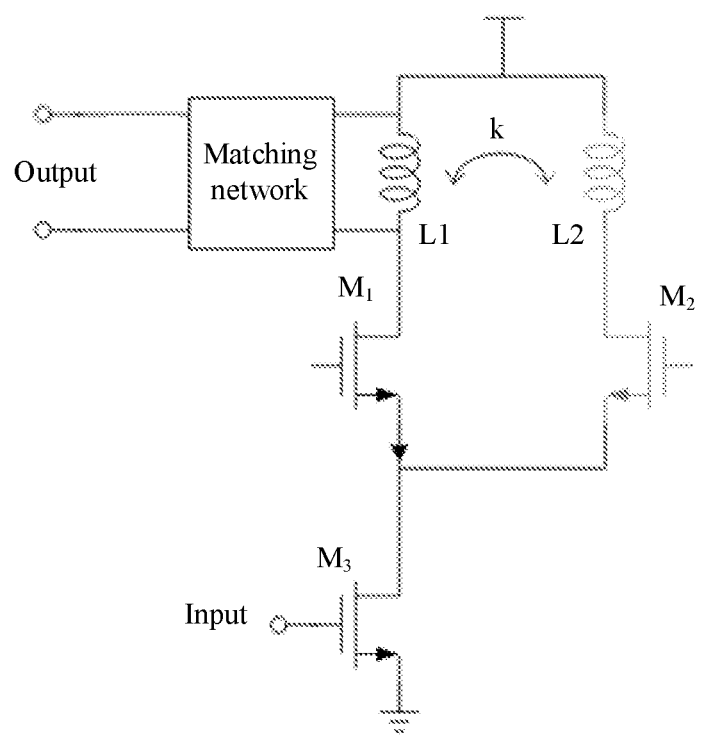
FIG. 7 is a schematic structural diagram of a fifth variable gain amplifier according to an embodiment of this application.

For example, if the drain of the first active transistor is coupled to the one end of the inductive adjustment circuit 304, and the other end of the inductive adjustment circuit 304 is coupled to the second power supply voltage, a possible structure of the variable gain amplifier may be shown in FIG. 7 (in FIG. 7, an example in which the power supplies that provide the first power supply voltage and the first power supply voltage are a same power supply is used as an example.) In FIG. 7, $M_1$ may be considered as a first common-gate transistor, $M_3$ may be considered as a first common-source transistor, $M_2$ may be considered as a first active transistor, a set of L1 and an output matching network may be considered as an inductive load, and L2 may be considered as an inductive adjustment circuit. A drain of $M_2$ is connected to a power supply voltage through L2. A gate of $M_2$ is configured to receive a control voltage to control on/off of $M_2$, or a bias voltage of the gate of $M_2$ is adjustable, to implement gain adjustment. L2 and L1 are mutually inducted to calibrate a phase and a gain step of an output signal of the variable gain amplifier.

Figure 8:
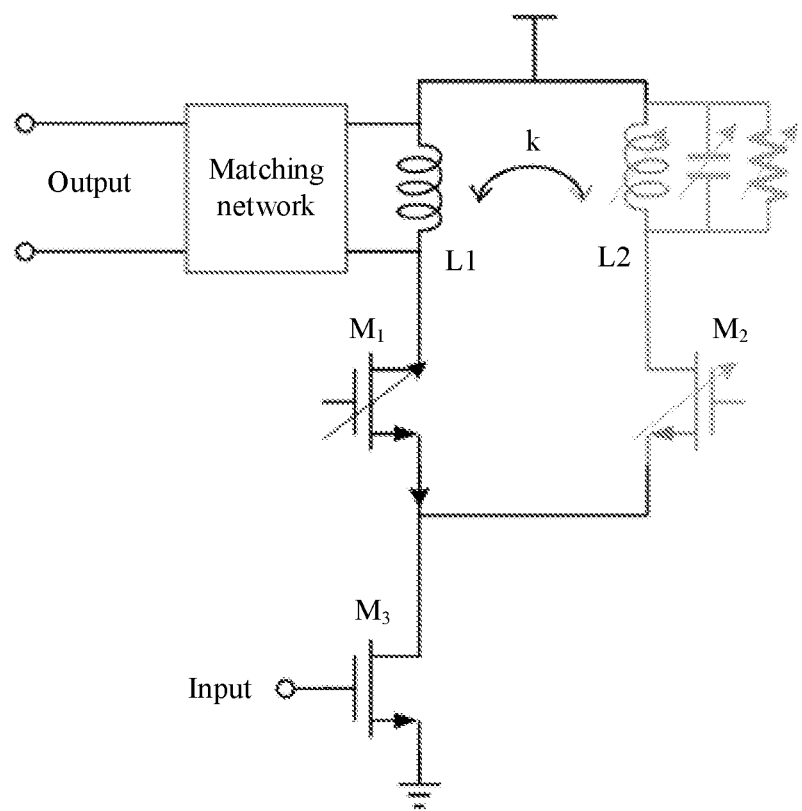
FIG. 8 is a schematic structural diagram of a sixth variable gain amplifier according to an embodiment of this application.

In the variable gain amplifier shown in FIG. 7, when $M_2$ is turned off, L2 is similar to an open circuit, the inductor does not work in an $M_2$ shunt branch, and an inductance value of L2 may be considered as infinite. When $M_2$ is turned on, a branch on which $M_2$ is located may be considered as a shunt branch, and a shunted alternating current affects output through mutual inductance between L2 and L1. In this case, the inductance value of L2 is no longer infinite. Therefore, it can be learned that under control of $M_2$ (equivalent to the control circuit 302), the inductance value of the inductor L2 (equivalent to the inductive adjustment circuit 304) can be adjusted. In other words, in this embodiment of this application, the inductive adjustment circuit 304 is adjustable. In addition, in the variable gain amplifier shown in FIG. 7, the inductive adjustment circuit may further include an adjustable resistor R and a variable capacitor C that are separately connected to L2 in parallel, as shown in FIG. 8. According to the solution shown in FIG. 8, any gain state of the variable gain amplifier can be controlled, and a calibration effect is better.

Figure 9:
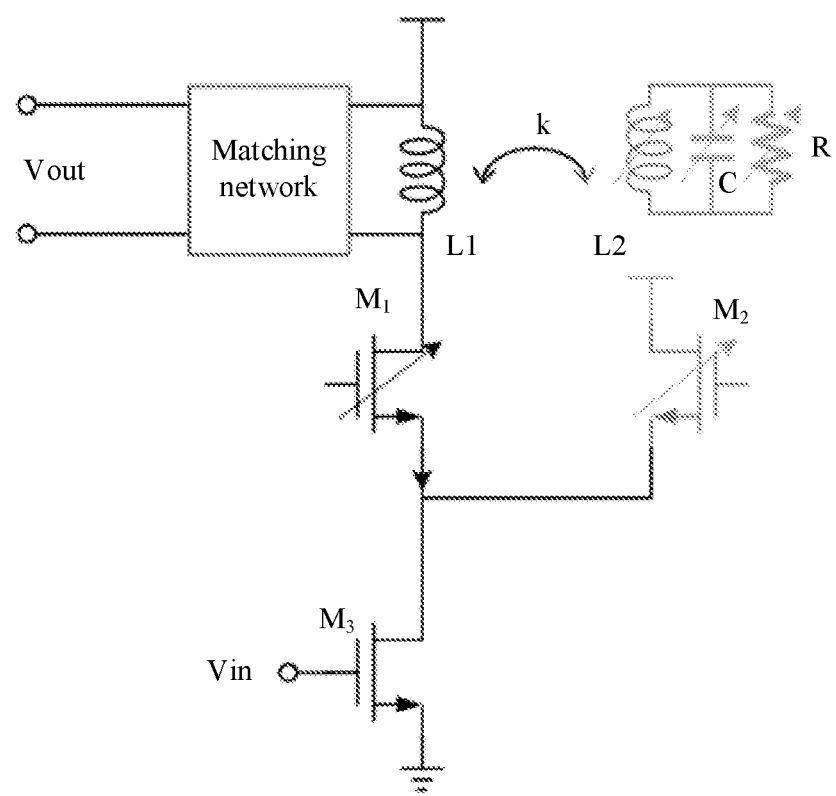
FIG. 9 is a schematic structural diagram of a seventh variable gain amplifier according to an embodiment of this application.

For example, if the drain of the first active transistor is coupled to the first power supply voltage, a possible structure of the variable gain amplifier may be shown in FIG. 9. In FIG. 9, $M_1$ may be considered as a first common-gate transistor, $M_3$ may be considered as a first common-source transistor, $M_2$ may be considered as a first active transistor, a set of L1 and an output matching network may be considered as an inductive load, and L2, R, and C that are connected in parallel may be considered as an inductive adjustment circuit. A drain of $M_2$ is connected to a power supply voltage. An RLC network including L2 is disposed independently of a control circuit. A gate of $M_2$ is configured to receive a control voltage to control on/off of $M_2$, or a bias voltage of the gate of $M_2$ is adjustable, to implement gain adjustment. The RLC network and L1 are mutually inducted to calibrate a phase and a gain step of an output signal of the variable gain amplifier.

In addition, in Implementation 1, the variable gain amplifier may further use the differential structure.

Figure 10:
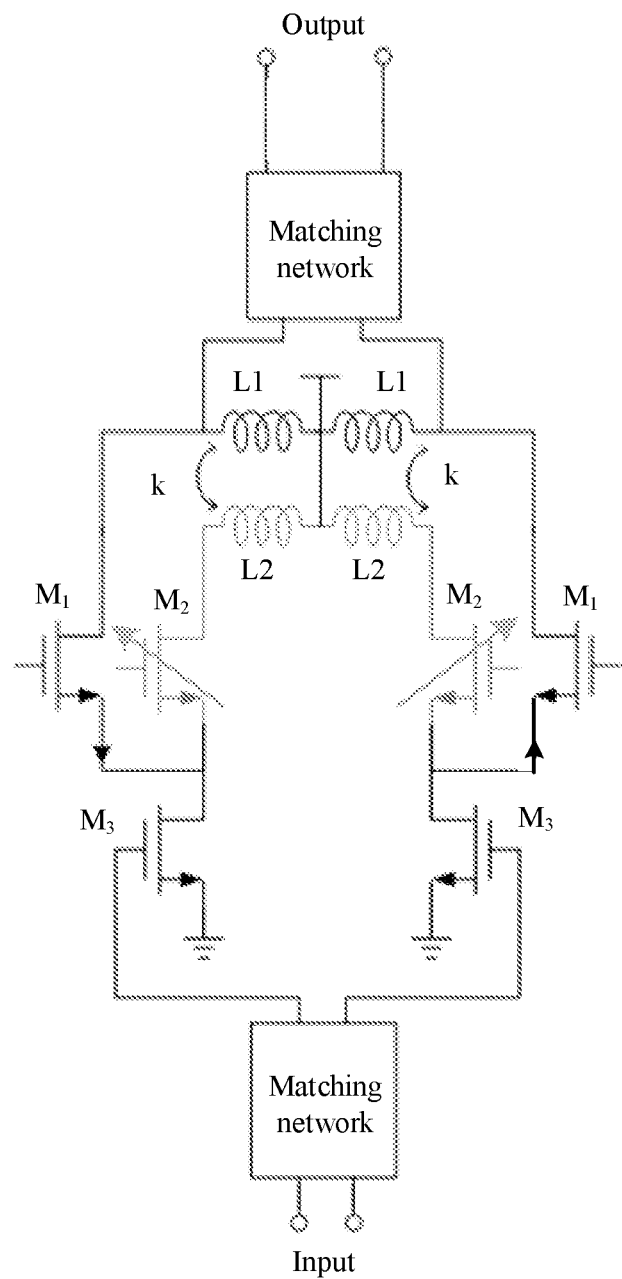
FIG. 10 is a schematic structural diagram of an eighth variable gain amplifier according to an embodiment of this application.

For example, the variable gain amplifier using the differential structure may be shown in FIG. 10. $M_1$ may be considered as a first common-gate transistor, $M_3$ may be considered as a first common-source transistor, $M_2$ may be considered as a first active transistor, a set of L1 and an output matching network may be considered as an inductive load, and L2 may be considered as an inductive adjustment circuit. A gain can be variable through $M_2$ shunting or by adjusting a bias voltage of $M_2$. L1 and L2 are mutually inducted to calibrate a phase of an output signal and a gain step of the variable gain amplifier.

Figure 11:
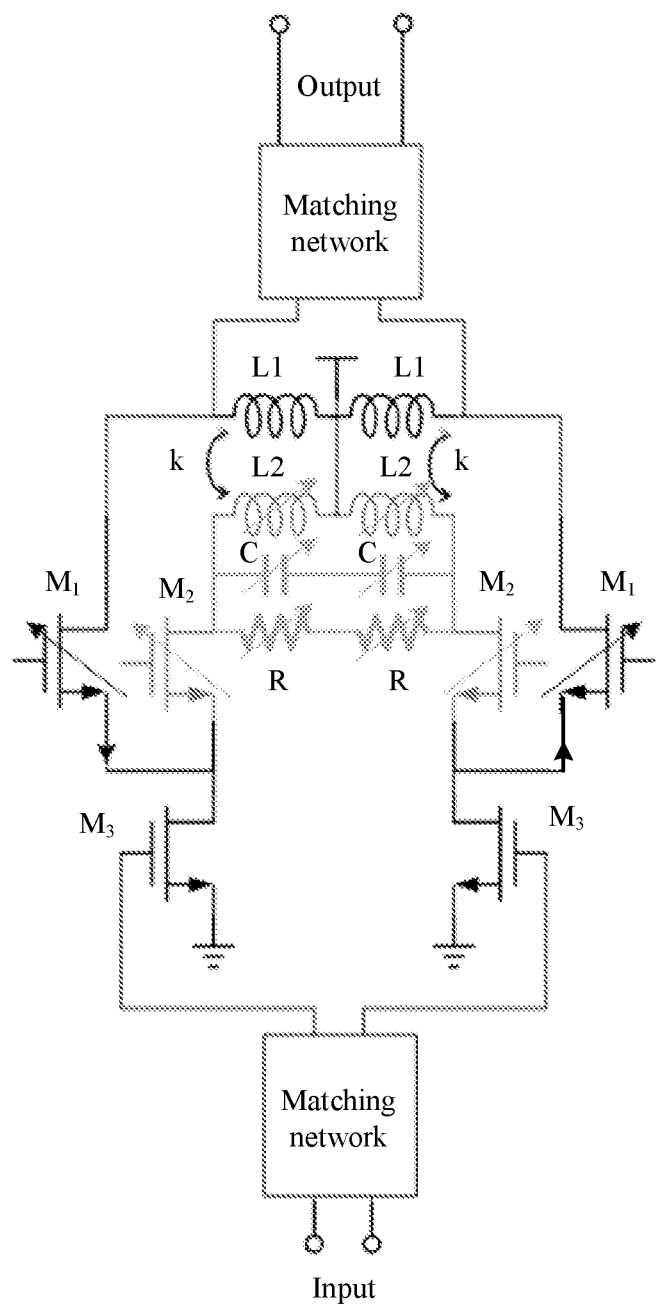
FIG. 11 is a schematic structural diagram of a ninth variable gain amplifier according to an embodiment of this application.
Figure 12:
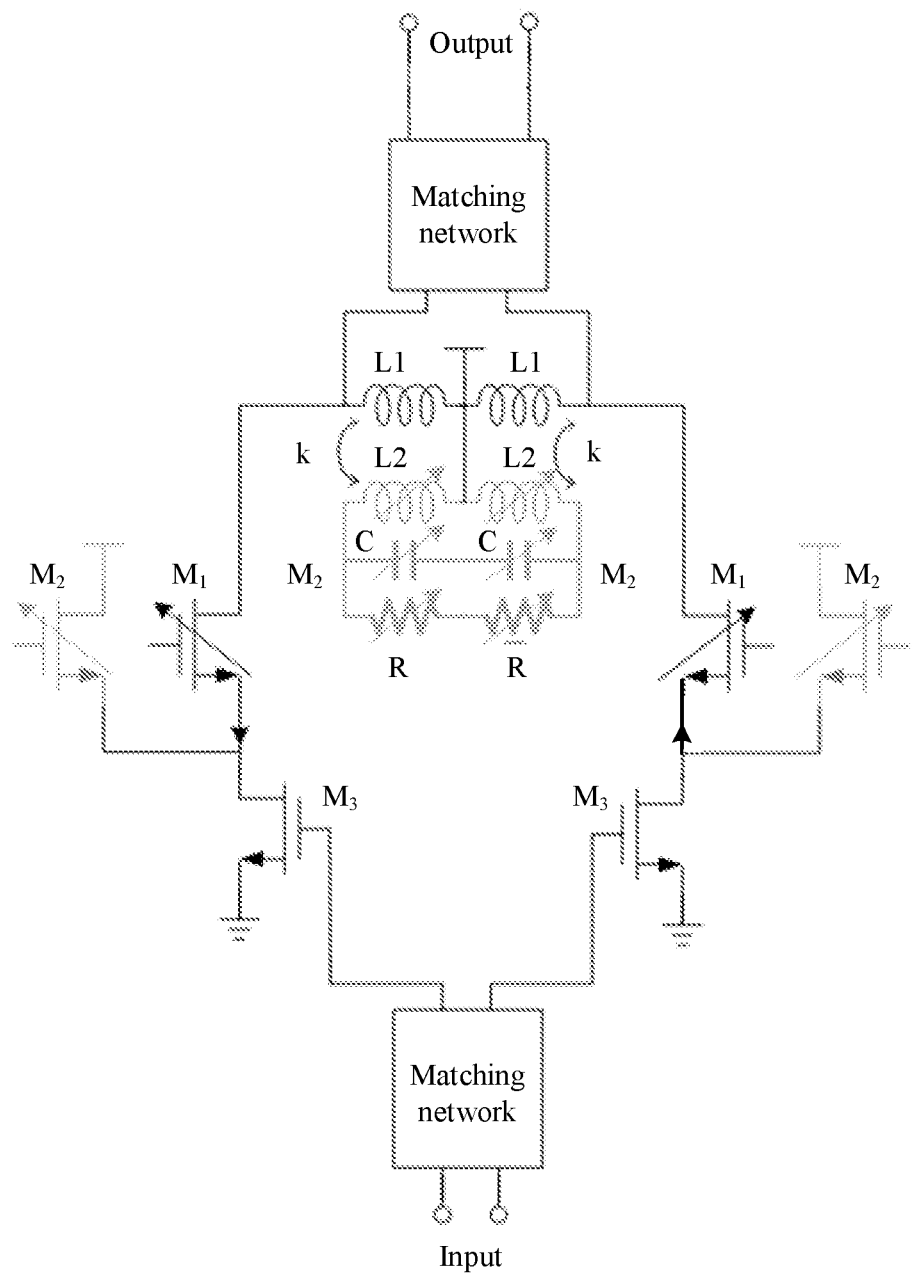
FIG. 12 is a schematic structural diagram of a tenth variable gain amplifier according to an embodiment of this application.

In addition, the inductive adjustment circuit may further include an adjustable resistor R and a variable capacitor C that are separately connected to L2 in parallel, as shown in FIG. 11. The inductive adjustment circuit may alternatively be disposed independently of a control circuit, as shown in FIG. 12.

It should be noted that, in an actual application, in the variable gain amplifier of the differential structure, a function of amplifying a differential component may be implemented by a plurality of cascode amplifiers connected in parallel, and each cascode amplifier includes $M_1$ and $M_3$. Correspondingly, the variable gain amplifier needs to further include a plurality of control circuits (namely, a plurality of $M_2$) that one-to-one correspond to the plurality of cascode amplifiers. In this case, $M_1$ may also be disposed as an active transistor whose on/off is adjustable or whose bias voltage is adjustable, so that a gain variation of the variable gain amplifier is more diversified. Therefore, in the schematic diagrams of FIG. 11 and FIG. 12, $M_1$ is also set to be adjustable. Adjusting $M_1$ and $M_2$ at the same time makes the gain variation of the variable gain amplifier more diversified.

It is not difficult to understand that the variable gain amplifier provided in Implementation 1 may be considered as being obtained by improving (adding the inductive adjustment circuit) on the basis of the example (a) in FIG. 2.

Implementation 2

In Implementation 2, the control circuit 302 is configured to adjust a bias voltage of the first common-source transistor. When the bias voltage of the gate of the first common-source transistor changes, a current of the first common-source transistor changes, thereby changing the gain of the amplification circuit 301.

In Implementation 2, the inductive adjustment circuit 304 may be disposed independently of the amplification circuit 301 and the control circuit 302. To be specific, the inductive adjustment circuit 304 is independently disposed on the side close to the inductive load 303 and far from the output end of the variable gain amplifier 300. The phase and the gain step of the output signal of the variable gain amplifier can be calibrated by using the inductive adjustment circuit 304 inductively coupled to the inductive load 303.

Figure 13:
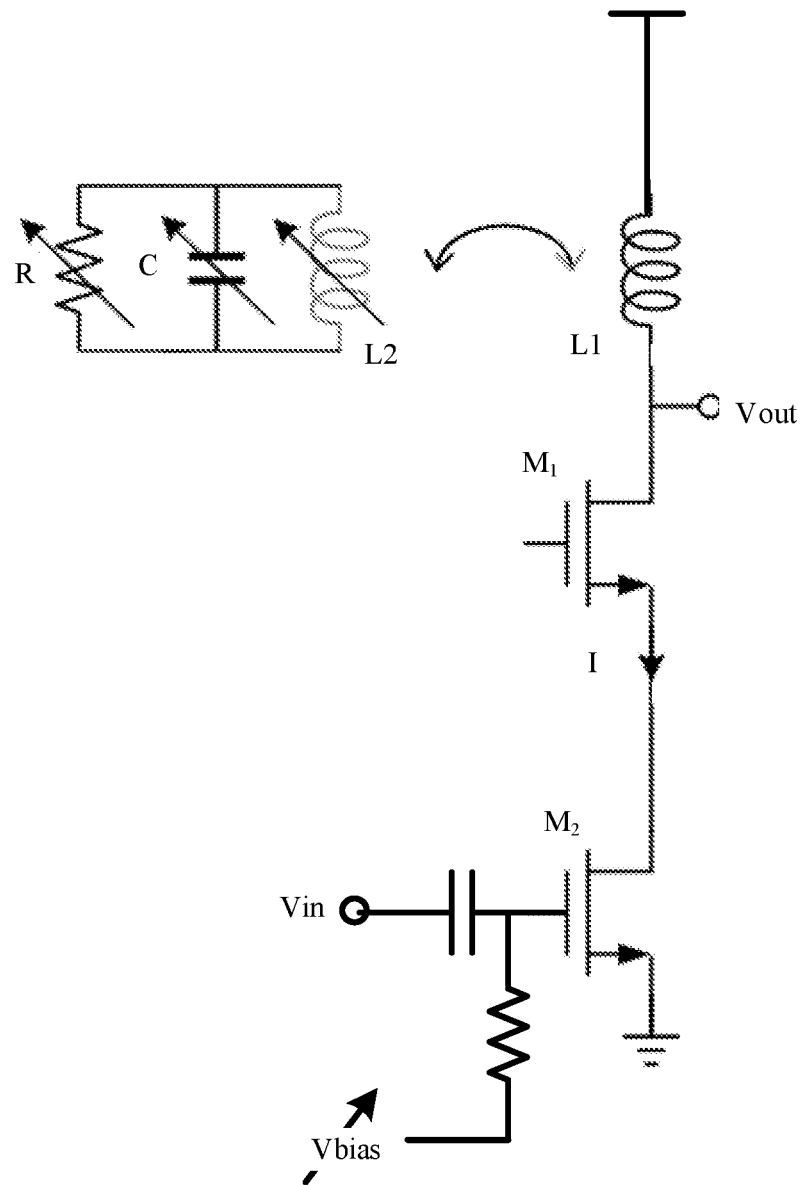
FIG. 13 is a schematic structural diagram of an eleventh variable gain amplifier according to an embodiment of this application.

For example, a possible implementation of the variable gain amplifier may be shown in FIG. 13.

In FIG. 13, L1 may be considered as an inductive load, an adjustable inductor L2, an adjustable resistor R, and a variable capacitor C that are connected in parallel may be considered as an inductive adjustment circuit, $M_1$ may be considered as a first common-gate transistor, and $M_2$ may be considered as a first common-source transistor. In the variable gain amplifier shown in FIG. 13, a current of $M_2$ may be changed by adjusting a bias voltage Vbias, thereby changing a gain of the variable gain amplifier.

In addition, calibration of a phase and a gain step of an output signal of the variable gain amplifier may be implemented by changing one or more of an inductance value of L2, a resistance value of R, and a capacitance value of C in an RLC network mutually inductive to L1.

It should be noted that in the example in FIG. 13, an example in which the variable gain amplifier uses the single-ended structure is used for illustration. In a specific implementation, the variable gain amplifier may alternatively use the differential structure, and gain adjustment is implemented by changing bias voltages of two common-source transistors in the differential structure. In addition, the phase and the gain step of the output signal of the variable gain amplifier are calibrated by using two inductive adjustment circuits that are separately mutually inductive to two inductive loads. A specific implementation is not described herein again.

It is not difficult to understand that the variable gain amplifier provided in Implementation 2 may be considered as being obtained by improving (adding the inductive adjustment circuit) on the basis of the example (b) in FIG. 2.

Implementation 3

In Implementation 3, in addition to the first cascode amplifier, the amplification circuit 301 further includes a second cascode amplifier. The second cascode amplifier and the first cascode amplifier constitute a differential amplification circuit 301. The second cascode amplifier includes a second common-gate transistor and a second common-source transistor. For a connection relationship between the second common-gate transistor and the second common-source transistor in the second cascode amplifier, refer to the connection relationship between the first common-gate transistor and the first common-source transistor in the first cascode transistor. Details are not described herein again.

The control circuit 302 includes a first active transistor and a second active transistor. A source of the first active transistor is coupled to the ground, and a drain of the first active transistor is coupled to a drain of the second common-source transistor. A source of the second active transistor is coupled to the ground, a drain of the second active transistor is coupled to the drain of the first common-source transistor. Each of a gate of the first active transistor and a gate of the second active transistor is configured to receive a control voltage to control on/off, or bias voltages of the gate of the first active transistor and the gate of the second active transistor are adjustable.

In Implementation 3, the first active transistor and the second active transistor are controlled by a same control voltage, and the first active transistor and the second active transistor are simultaneously turned on or simultaneously turned off; or the bias voltages applied to the gate of the first active transistor and the gate of the second active transistor are the same, so that magnification factors of two differential components are the same.

In the foregoing implementation, an amplification function of the amplification circuit 301 on a differential input signal may be implemented by using the first cascode amplifier and the second cascode amplifier. The first active transistor is configured to inject a reverse current into the second cascode amplifier, and the second active transistor is configured to inject a reverse current into the first cascode amplifier. When the reverse current is injected, an output current of the variable gain amplifier decreases and a gain decreases. When adjusting the gain of the amplification circuit 301, the control circuit 302 may control on/off of the first active transistor and the second active transistor by using the control voltage, to implement high-low gain switching of the variable gain amplifier. Alternatively, currents may be changed by adjusting the bias voltages of the first active transistor and the second active transistor, thereby changing a value of the injected reverse current and further changing the gain of the variable gain amplifier.

In Implementation 3, the inductive adjustment circuit 304 may be disposed independently of the amplification circuit 301 and the control circuit 302. To be specific, the inductive adjustment circuit 304 is independently disposed on the side close to the inductive load 303 and far from the output end of the variable gain amplifier 300. The phase and the gain step of the output signal of the variable gain amplifier can be calibrated by using the inductive adjustment circuit 304 inductively coupled to the inductive load 303.

Figure 14:
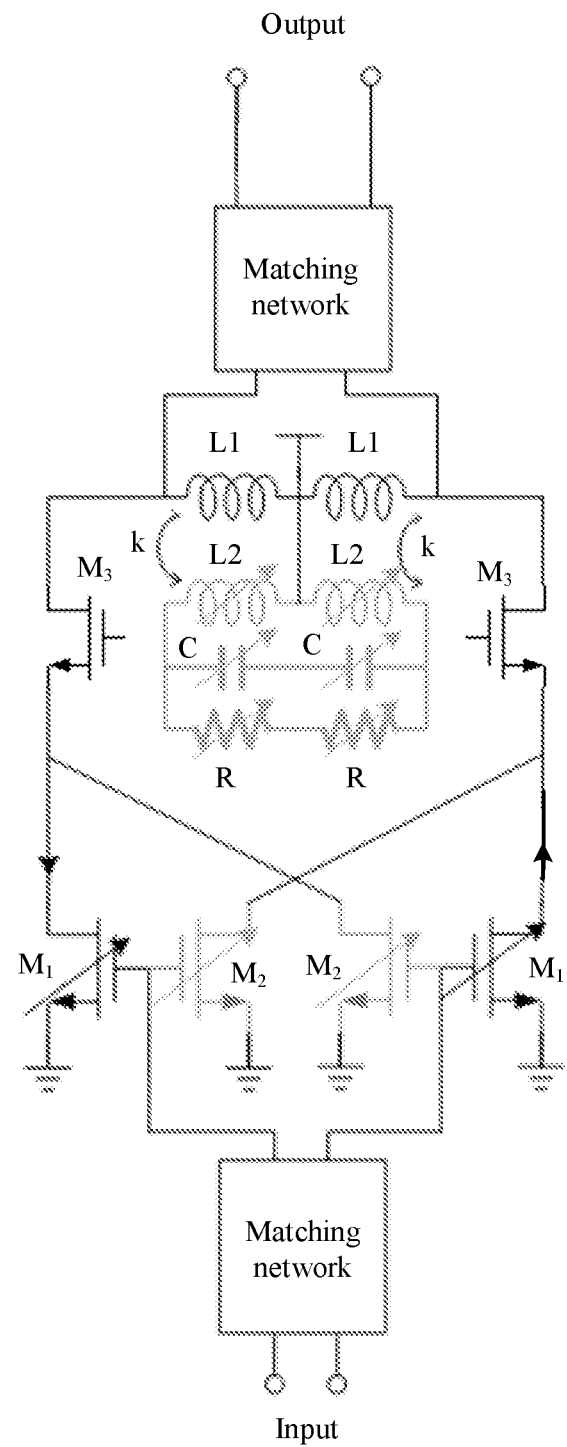
FIG. 14 is a schematic structural diagram of a twelfth variable gain amplifier according to an embodiment of this application.

For example, a possible implementation of the variable gain amplifier may be shown in FIG. 14. In FIG. 14, a set of L1 and an output matching network may be considered as an inductive load, and an adjustable inductor L2, an adjustable resistor R, and a variable capacitor C that are connected in parallel may be considered as an inductive adjustment circuit. $M_1$ on the left may be considered as a first common-source transistor, and $M_1$ on the right may be considered as a second common-source transistor. $M_3$ on the left may be considered as a first common-gate transistor, and $M_3$ on the right may be considered as a second common-gate transistor. $M_2$ on the left may be considered as a first active transistor, and $M_2$ on the right may be considered as a second active transistor. In the variable gain amplifier shown in FIG. 14, a current of $M_2$ may be changed by adjusting a bias voltage of $M_2$, thereby changing a gain of the variable gain amplifier. Alternatively, reverse current injection and cutoff are implemented by adjusting on/off of $M_2$, thereby changing the gain of the variable gain amplifier.

Calibration of a phase and a gain step of an output signal of the variable gain amplifier may be implemented by changing one or more of an inductance value of L2, a resistance value of R, and a capacitance value of C in an RLC network mutually inductive to L1.

In addition, in the schematic diagram of FIG. 14, $M_1$ is also set to be adjustable. Adjusting $M_1$ and $M_2$ at the same time makes a gain variation of the variable gain amplifier more diversified.

It is not difficult to understand that the variable gain amplifier provided in Implementation 3 may be considered as being obtained by improving (adding the inductive adjustment circuit) on the basis of the example (c) in FIG. 2.

Implementation 4

In Implementation 4, in addition to the first cascode amplifier, the amplification circuit 301 further includes a second cascode amplifier. The second cascode amplifier and the first cascode amplifier constitute a differential amplification circuit 301. The second cascode amplifier includes a second common-gate transistor and a second common-source transistor. For a connection relationship between the second common-gate transistor and the second common-source transistor in the second cascode amplifier, refer to the connection relationship between the first common-gate transistor and the first common-source transistor in the first cascode transistor. Details are not described herein again.

The control circuit 302 includes a first active transistor and a second active transistor. A source of the first active transistor is coupled to the source of the first common-gate transistor, and a drain of the first active transistor is coupled to a drain of the second common-gate transistor. A source of the second active transistor is coupled to a source of the second common-gate transistor, and a drain of the second active transistor is coupled to the drain of the first common-gate transistor. Each of a gate of the first active transistor and a gate of the second active transistor is configured to receive a control voltage to control on/off, or bias voltages of the gate of the first active transistor and the gate of the second active transistor are adjustable.

The first active transistor and the second active transistor are controlled by a same control voltage, and the first active transistor and the second active transistor are simultaneously turned on or simultaneously turned off; or the bias voltages applied to the gate of the first active transistor and the gate of the second active transistor are the same, so that magnification factors of two differential components are the same.

In the foregoing implementation, an amplification function of the amplification circuit 301 on a differential input signal may be implemented by using the first cascode amplifier and the second cascode amplifier. The first active transistor is configured to inject a reverse current into the second cascode amplifier, and the second active transistor is configured to inject a reverse current into the first cascode amplifier. When the reverse current is injected, an output current of the variable gain amplifier decreases and a gain decreases. When adjusting the gain of the amplification circuit 301, the control circuit 302 may control on/off of the first active transistor and the second active transistor by using the control voltage, to implement high-low gain switching of the variable gain amplifier. Alternatively, currents may be changed by adjusting the bias voltages of the first active transistor and the second active transistor, thereby changing a value of the injected reverse current and further changing the gain of the variable gain amplifier.

In Implementation 4, the inductive adjustment circuit 304 may be disposed independently of the amplification circuit 301 and the control circuit 302. To be specific, the inductive adjustment circuit 304 is independently disposed on the side close to the inductive load and far from the output end of the variable gain amplifier 300. The phase and the gain step of the output signal of the variable gain amplifier can be calibrated by using the inductive adjustment circuit 304 inductively coupled to the inductive load 303.

Figure 15:
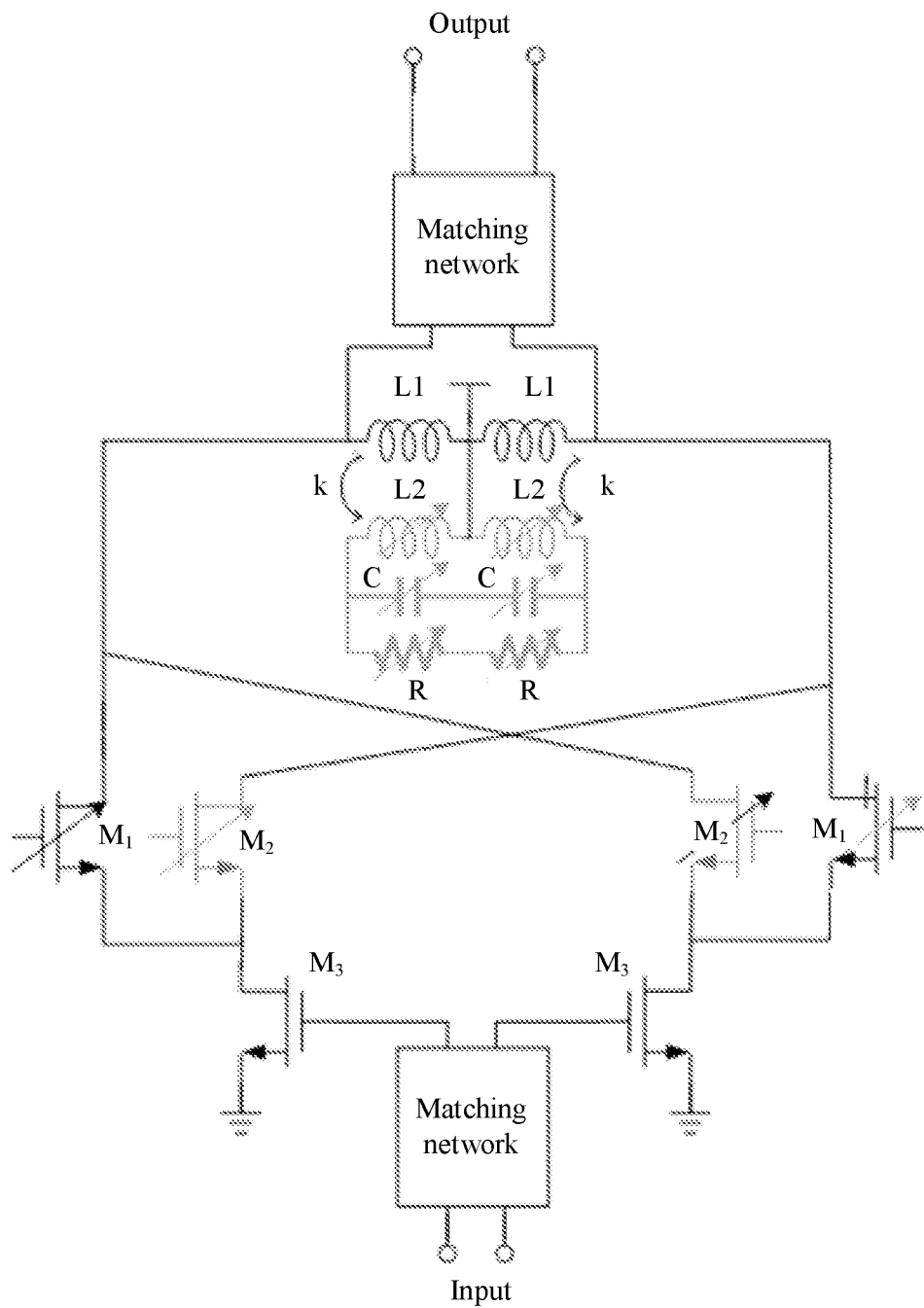
FIG. 15 is a schematic structural diagram of a thirteenth variable gain amplifier according to an embodiment of this application.

For example, a possible implementation of the variable gain amplifier may be shown in FIG. 15. In FIG. 15, a set of L1 and an output matching network may be considered as an inductive load, and an adjustable inductor L2, an adjustable resistor R, and a variable capacitor C that are connected in parallel may be considered as an inductive adjustment circuit. $M_1$ on the left may be considered as a first common-gate transistor, and $M_1$ on the right may be considered as a second common-gate transistor. $M_3$ on the left may be considered as a first common-source transistor, and $M_3$ on the right may be considered as a second common-source transistor. $M_2$ on the left may be considered as a first active transistor, and $M_2$ on the right may be considered as a second active transistor. In the variable gain amplifier shown in FIG. 15, a current of $M_2$ may be changed by adjusting a bias voltage of $M_2$, thereby changing a gain of the variable gain amplifier. Alternatively, reverse current injection and cutoff are implemented by adjusting on/off of $M_2$, thereby changing the gain of the variable gain amplifier.

Calibration of a phase and a gain step of an output signal of the variable gain amplifier may be implemented by changing one or more of an inductance value of L2, a resistance value of R, and a capacitance value of C in an RLC network mutually inductive to L1.

In addition, in the schematic diagram of FIG. 15, $M_1$ is also set to be adjustable. Adjusting $M_1$ and $M_2$ at the same time makes a gain variation of the variable gain amplifier more diversified.

It is not difficult to understand that the variable gain amplifier provided in Implementation 4 may be considered as being obtained by improving (adding the inductive adjustment circuit) on the basis of the example (d) in FIG. 2.

It should be noted that in the foregoing several examples, an example in which the active transistor is an N-channel CMOS is used as an example for description. In an actual implementation, the active transistor may alternatively be a P-channel CMOS, an NPN transistor, or a PNP transistor. When the active transistor uses the foregoing different implementations, ground ports and ports connected to a power supply voltage of the active transistor may be different. A specific grounding manner and a specific power supply connection manner are the same as those in the conventional technology, and details are not described in this embodiment of this application.

Figure 16:
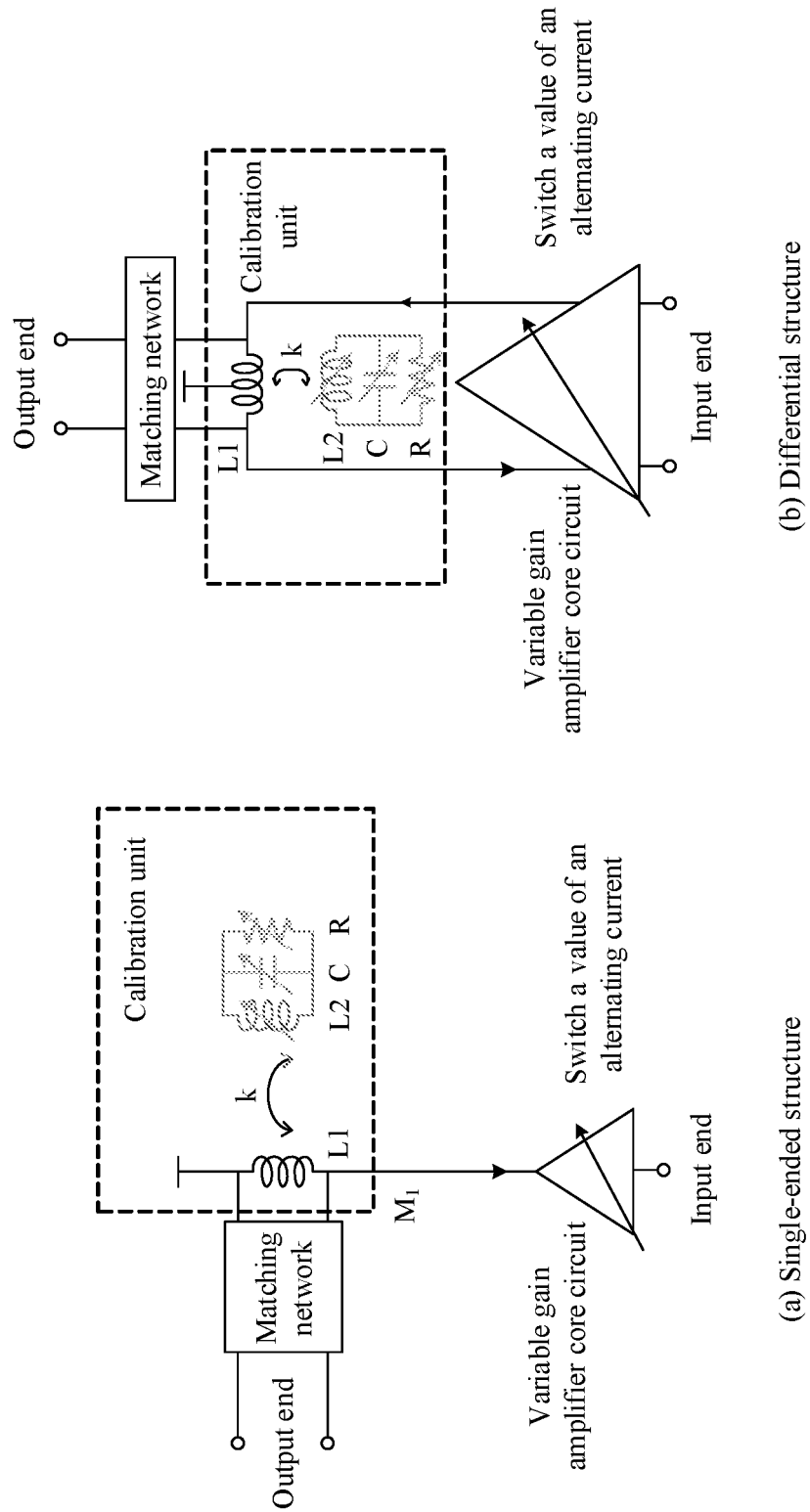
FIG. 16 is a schematic structural diagram of a fourteenth variable gain amplifier according to an embodiment of this application.

From the foregoing examples, it is not difficult to understand that the variable gain amplifier provided in the embodiments of this application may be divided into two parts: a variable gain amplifier core circuit and a calibration unit, as shown in FIG. 16. When the variable gain amplifier uses the single-ended structure, for an implementation structure of the variable gain amplifier, refer to an example (a) in FIG. 16. When the variable gain amplifier uses the differential structure, for an implementation structure of the variable gain amplifier, refer to an example (b) in FIG. 16. The variable gain amplifier core circuit may use any active VGA topology structure in the conventional technology. In this embodiment of this application, a phase and a gain step of an output signal of the variable gain amplifier can be calibrated by using an inductive adjustment circuit (namely, an RLC network in FIG. 16) inductively coupled to an inductive load (namely, a set of an output matching network and L1 in FIG. 16).

It should also be noted that in the VGA provided in the embodiments of this application, the phase and the gain step of the output signal of the VGA are calibrated by using the inductive adjustment circuit 304. In addition to being applied to a VGA, the inductive adjustment circuit 304 may be further applied to another amplifier that has a gain switching function, for example, a low-noise amplifier (low-noise amplifier, LNA). The amplifier that has the gain switching function also has problems that a phase is inconstant and a gain step is unstable with change in a frequency. The inductive adjustment circuit 304 is disposed in such an amplifier, and a phase and a gain step of an output signal of the amplifier may also be calibrated.

Figure 17:
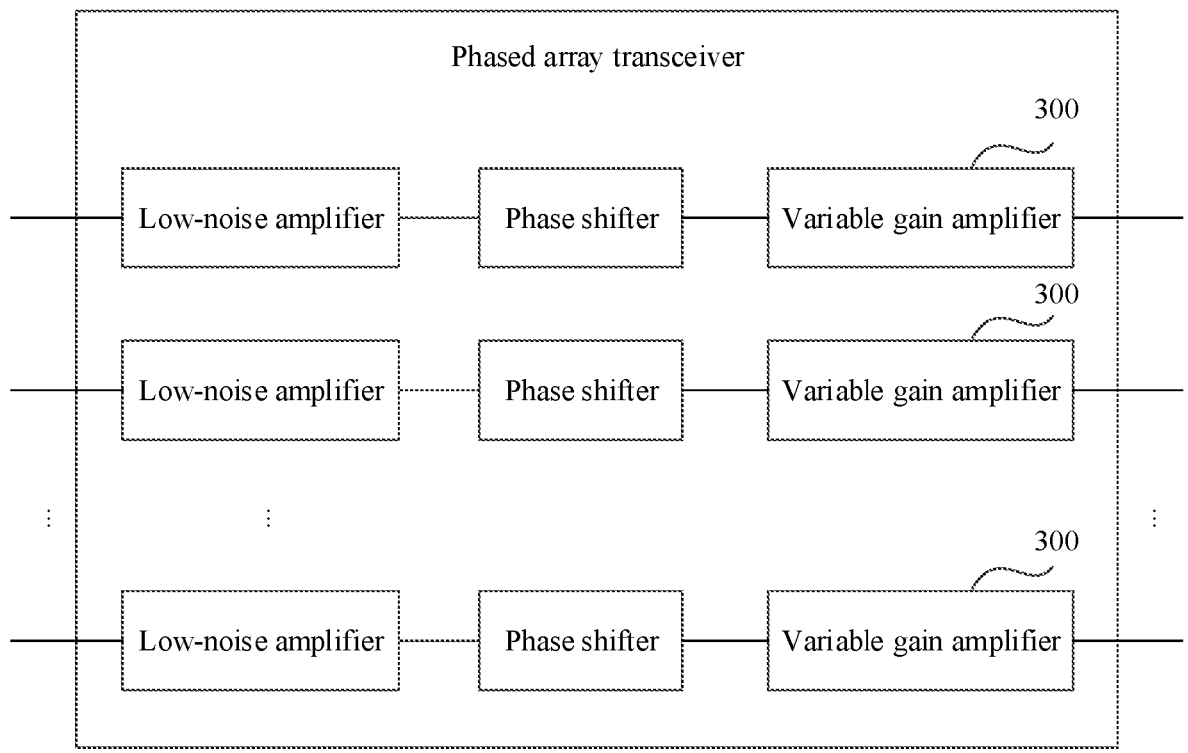
FIG. 17 is a schematic structural diagram of a phased array transceiver according to an embodiment of this application.

An embodiment of this application further provides a phased array transceiver. As shown in FIG. 17, the phased-array transceiver includes a plurality of phased array channels, and each phased array channel includes a low-noise amplifier, a phase shifter, and the variable gain amplifier 300 that are connected in series. The phase shifter is configured to implement a fixed phase shift of an input signal, and the variable gain amplifier 300 is configured to implement a variable gain of the input signal and keep the fixed phase shift of the input signal unchanged.

Beam receiving and sending in a fixed direction can be implemented by using the phased array transceiver shown in FIG. 17. In the phased array transceiver, if the variable gain amplifier provided in the conventional technology is used, because the low-noise amplifier and the variable gain amplifier each introduces a phase shift when a gain is switched, and a delay of each component in the phased array channel also causes a phase error. As a result, each phased array channel cannot keep the fixed phase shift implemented by the phase shifter, and a direction and a gain of a beam is affected. However, if the variable gain amplifier 300 provided in the embodiments of this application is used, because the variable gain amplifier 300 can calibrate a phase of an output signal, the fixed phase shift of the input signal can be kept unchanged, beam receiving and sending in the fixed direction can be implemented, and beam precision can be improved.

It should be noted that in the phased array transceiver provided in this embodiment of this application, a serial sequence of the low-noise amplifier, the phase shifter, and the variable gain amplifier 300 is not specifically limited. FIG. 17 is merely a specific example.

Figure 18:
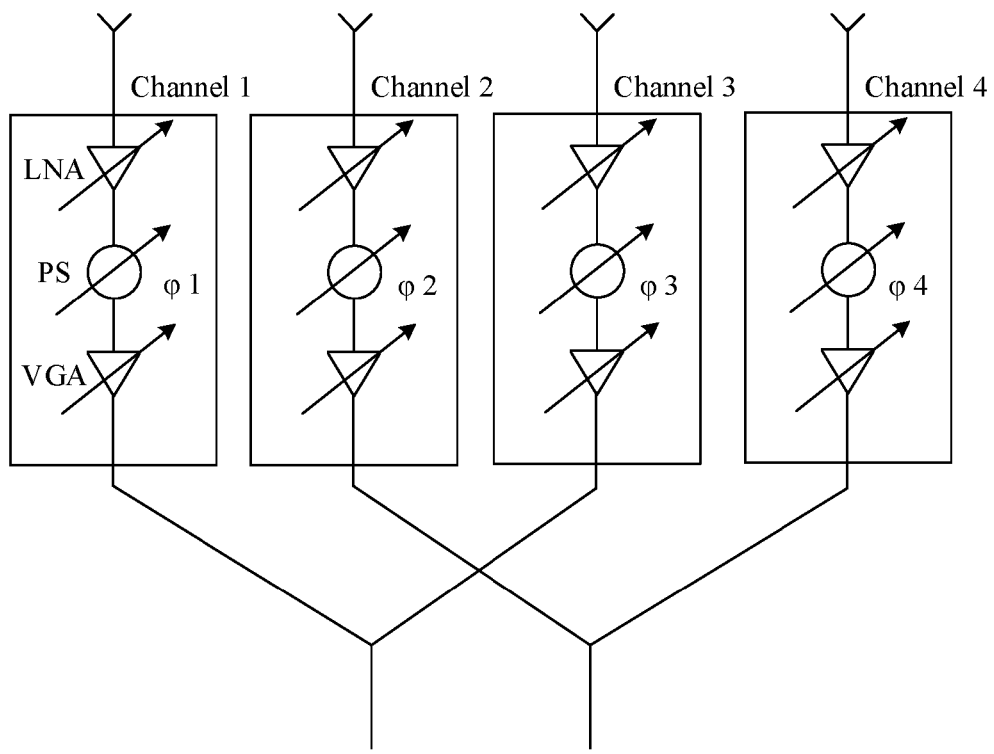
FIG. 18 is a schematic structural diagram of another phased array transceiver according to an embodiment of this application.

For example, a schematic structural diagram of a phased array transceiver including four phased array channels may be shown in FIG. 18. Each phased array channel includes an LNA, a phase shifter (phase shifter, PS), and the VGA provided in any one of the foregoing embodiments. In the phased array transceiver, to receive and send beams in a fixed direction, each channel needs to be switched to a fixed phase shift, for example, φ1, φ2, φ3, and φ4, and the phase shift is implemented by the PS. Accuracy of the phase shift affects beam accuracy and a gain of the phased array transceiver. Generally, the phase shift is introduced when the LNA and the VGA switch gains, and delays of the LNA and the VGA also cause the phase shift. However, when a variable gain is implemented by using the VGA provided in the embodiments of this application, the phase shift introduced when the LNA and the VGA switch the gains may be calibrated. Therefore, the fixed phase shift of each phased array channel can be kept unchanged, and beam precision can be improved.

Obviously, a person skilled in the art can make various modifications and variations to the embodiments of this application without departing from the scope of the embodiments of this application. This application is intended to cover these modifications and variations provided that they fall within the scope of protection defined by the following claims and their equivalent technologies.

What is claimed is:

1. A variable gain amplifier, comprising:
   an amplification circuit, configured to amplify an input signal;
   a control circuit, configured to control a gain of the amplification circuit by adjusting an output current of the amplification circuit;
   an inductive load, wherein the inductive load is coupled to a signal output end of the amplification circuit; and
   an inductive adjustment circuit, wherein the inductive adjustment circuit and the inductive load are inductively coupled, and wherein an output signal of the variable gain amplifier is calibratable based on adjusting an inductance value of the inductive adjustment circuit.

2. The variable gain amplifier according to claim 1, wherein the inductive adjustment circuit comprises an adjustable inductor.

3. The variable gain amplifier according to claim 2, wherein the inductive adjustment circuit further comprises an adjustable resistor connected to the adjustable inductor in parallel.

4. The variable gain amplifier according to claim 2, wherein the inductive adjustment circuit further comprises a variable capacitor connected to the adjustable inductor in parallel.

5. The variable gain amplifier according to claim 1, wherein the amplification circuit comprises a first active transistor, a source of the first active transistor is coupled to a ground, a drain of the first active transistor is the signal output end of the amplification circuit, and a gate of the first active transistor is configured to input the input signal.

6. The variable gain amplifier according to claim 5, wherein the control circuit is configured to adjust a bias voltage of the gate of the first active transistor.

7. The variable gain amplifier according to claim 5, wherein:
   the amplification circuit further comprises a second active transistor, and the second active transistor and the first active transistor constitute a differential amplification circuit;
   the control circuit comprises a third active transistor and a fourth active transistor;
   a source of the third active transistor is coupled to the ground, and a drain of the third active transistor is coupled to a drain of the second active transistor;
   a source of the fourth active transistor is coupled to the ground, and a drain of the fourth active transistor is coupled to the drain of the first active transistor; and
   each of a gate of the third active transistor and a gate of the fourth active transistor is configured to receive a control voltage to control on/off, or bias voltages of the gate of the third active transistor and the gate of the fourth active transistor are adjustable.

8. The variable gain amplifier according to claim 1, wherein the amplification circuit comprises a first cascode amplifier, wherein a drain of a first common-gate transistor in the first cascode amplifier is the signal output end of the amplification circuit, a gate of a first common-source transistor in the first cascode amplifier is configured to input the input signal, and a source of the first common-source transistor is coupled to a ground.

9. The variable gain amplifier according to claim 8, wherein:
the control circuit comprises a first active transistor;
a source of the first active transistor is connected to a source of the first common-gate transistor;
a drain of the first active transistor is coupled to a first power supply voltage, or a drain of the first active transistor is coupled to one end of the inductive adjustment circuit, and the other end of the inductive adjustment circuit is coupled to a second power supply voltage; and
a gate of the first active transistor is configured to receive a control voltage to control on/off of the first active transistor, or a bias voltage of the gate of the first active transistor is adjustable.

10. The variable gain amplifier according to claim 8, wherein the control circuit is configured to adjust a bias voltage of the first common-source transistor.

11. The variable gain amplifier according to claim 8, wherein:
the amplification circuit further comprises a second cascode amplifier, the second cascode amplifier and the first cascode amplifier constitute a differential amplification circuit, and the second cascode amplifier comprises a second common-gate transistor and a second common-source transistor;
the control circuit comprises a first active transistor and a second active transistor;
a source of the first active transistor is coupled to the ground, and a drain of the first active transistor is coupled to a drain of the second common-source transistor;
a source of the second active transistor is coupled to the ground, and a drain of the second active transistor is coupled to a drain of the first common-source transistor; and
each of a gate of the first active transistor and a gate of the second active transistor is configured to receive a control voltage to control on/off, or bias voltages of the gate of the first active transistor and the gate of the second active transistor are adjustable.

12. The variable gain amplifier according to claim 8, wherein:
the amplification circuit further comprises a second cascode amplifier, the second cascode amplifier and the first cascode amplifier constitute a differential amplification circuit, and the second cascode amplifier comprises a second common-gate transistor and a second common-source transistor;
the control circuit comprises a first active transistor and a second active transistor;
a source of the first active transistor is coupled to a source of a first cascode transistor, and a drain of the first active transistor is coupled to a drain of a second cascode transistor;
a source of the second active transistor is coupled to a source of the second cascode transistor, and a drain of the second active transistor is coupled to the drain of the first common-gate transistor; and
each of a gate of the first active transistor and a gate of the second active transistor is configured to receive a control voltage to control on/off, or bias voltages of the gate of the first active transistor and the gate of the second active transistor are adjustable.

13. The variable gain amplifier according to claim 1, wherein the variable gain amplifier is coupled to a next-stage circuit through the inductive load.

14. A phased array transceiver comprising:
a plurality of phased array channels, wherein each phased array channel comprises a low-noise amplifier;
a phase shifter, configured to implement a fixed phase shift of an input signal; and
a variable gain amplifier, wherein the plurality of phased array channels, the phase shifter, and the variable gain amplifier are connected in series, wherein the variable gain amplifier is configured to implement a variable gain of the input signal and keep the fixed phase shift of the input signal unchanged, and wherein the variable gain amplifier comprises:
an amplification circuit, configured to amplify the input signal;
a control circuit, configured to control a gain of the amplification circuit by adjusting an output current of the amplification circuit;
an inductive load, wherein the inductive load is coupled to a signal output end of the amplification circuit; and
an inductive adjustment circuit, wherein the inductive adjustment circuit and the inductive load are inductively coupled, and wherein an output signal of the variable gain amplifier is calibratable based on adjusting an inductance value of the inductive adjustment circuit.

15. The phased array transceiver according to claim 14, wherein the inductive adjustment circuit comprises an adjustable inductor.

16. The phased array transceiver according to claim 15, wherein the inductive adjustment circuit further comprises an adjustable resistor connected to the adjustable inductor in parallel.

17. The phased array transceiver according to claim 15, wherein the inductive adjustment circuit further comprises a variable capacitor connected to the adjustable inductor in parallel.

18. The phased array transceiver according to claim 14, wherein the amplification circuit comprises a first active transistor, a source of the first active transistor is coupled to a ground, a drain of the first active transistor is the signal output end of the amplification circuit, and a gate of the first active transistor is configured to input the input signal.

19. The phased array transceiver according to claim 18, wherein the control circuit is configured to adjust a bias voltage of the gate of the first active transistor.

20. The phased array transceiver according to claim 18, wherein:
the amplification circuit further comprises a second active transistor, and the second active transistor and the first active transistor constitute a differential amplification circuit;
the control circuit comprises a third active transistor and a fourth active transistor;
a source of the third active transistor is coupled to the ground, and a drain of the third active transistor is coupled to a drain of the second active transistor;
a source of the fourth active transistor is coupled to the ground, and a drain of the fourth active transistor is coupled to the drain of the first active transistor; and
each of a gate of the third active transistor and a gate of the fourth active transistor is configured to receive a control voltage to control on/off, or bias voltages of the gate of the third active transistor and the gate of the fourth active transistor are adjustable.

\* \* \* \* \*